United States Patent [19]

Hoigaard

[11] Patent Number: 5,083,117
[45] Date of Patent: Jan. 21, 1992

[54] APPARATUS FOR MONITORING AND CONTROLLING ELECTROSTATIC DISCHARGE

[76] Inventor: Jan C. Hoigaard, 5940 Flintridge Dr., Colorado Springs, Colo. 80918

[21] Appl. No.: 564,057

[22] Filed: Aug. 7, 1990

Related U.S. Application Data

[63] Continuation of Ser. No. 204,216, Jun. 7, 1988, abandoned.

[51] Int. Cl.⁵ .............................................. G08B 21/00
[52] U.S. Cl. .................................... 340/649; 340/635; 324/510; 361/212
[58] Field of Search ............... 340/505, 517, 649, 650, 340/635; 364/413.02, 413.03; 324/510, 511, 525, 531; 361/212, 220; 174/5 R, 5 SB, 5 SG; 128/908

[56] References Cited

U.S. PATENT DOCUMENTS

| Re. 32,468 | 8/1987 | Le Nay et al. | 340/505 |
| 4,023,139 | 5/1977 | Samburg | 340/506 |
| 4,340,885 | 7/1982 | Chavis et al. | 340/632 |
| 4,649,374 | 3/1987 | Hoigaard | 340/649 |
| 4,658,243 | 4/1987 | Kimura et al. | 340/505 |
| 4,961,157 | 10/1990 | Nick et al. | 324/158 R |

Primary Examiner—Jin F. Ng
Assistant Examiner—Jill Jackson
Attorney, Agent, or Firm—Dorr, Carson, Sloan & Peterson

[57] ABSTRACT

The apparatus for monitoring and controlling electrostatic discharge control systems provides an automated sequence of electrostatic discharge control and soldering iron performance measurements that can be used to verify the continued integrity of the electrostatic discharge control systems. This is accomplished by a microprocessor controlled central data acquisition and control unit that controls a plurality of test units. Each work station in the manufacturing environment is equipped with a test unit that performs a number of measurements and tests of various electrostatic discharge control systems and soldering iron performance. The central data acquisition and control unit sequentially and automatically polls each individual test unit to perform or prompt the operator to participate in the designated measurements. The data obtained by each test unit is transferred to the central data acquisition and control unit where the data is analyzed and recorded. This data can be used to generate an alarm when one of the test units indicates a failure of the associated electrostatic discharge control systems or the soldering iron operation. In addition, the collected data provides an on-going record of long-term performance of the electrostatic discharge control systems and the individual soldering irons at each test unit.

71 Claims, 6 Drawing Sheets

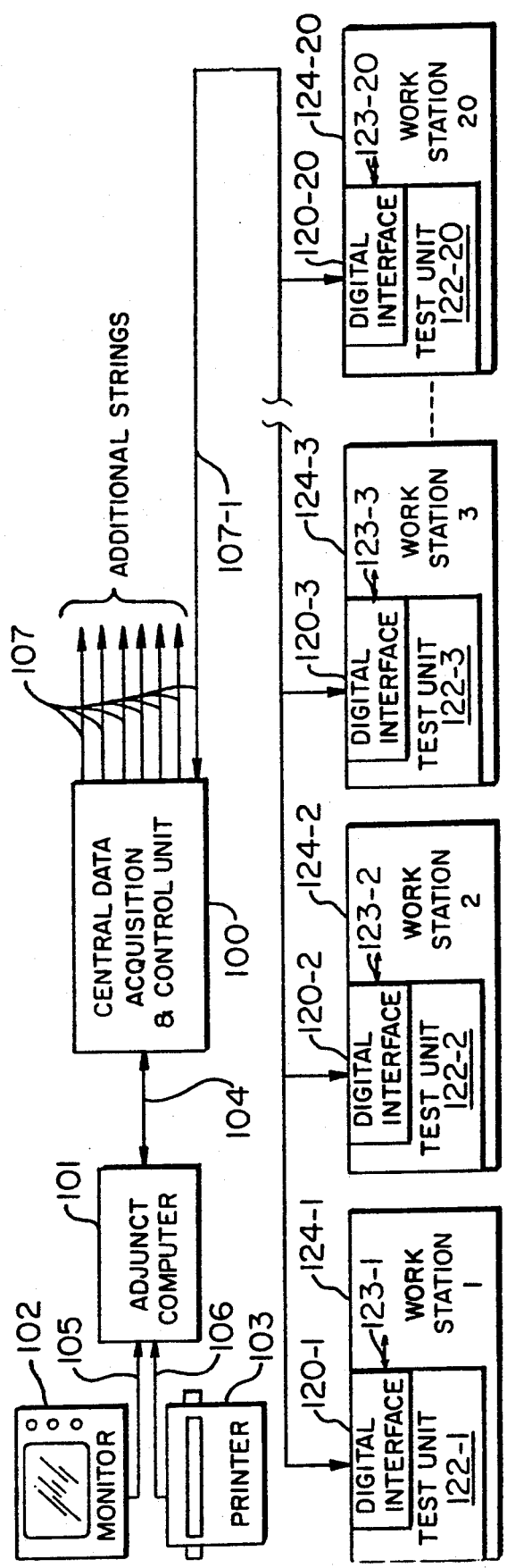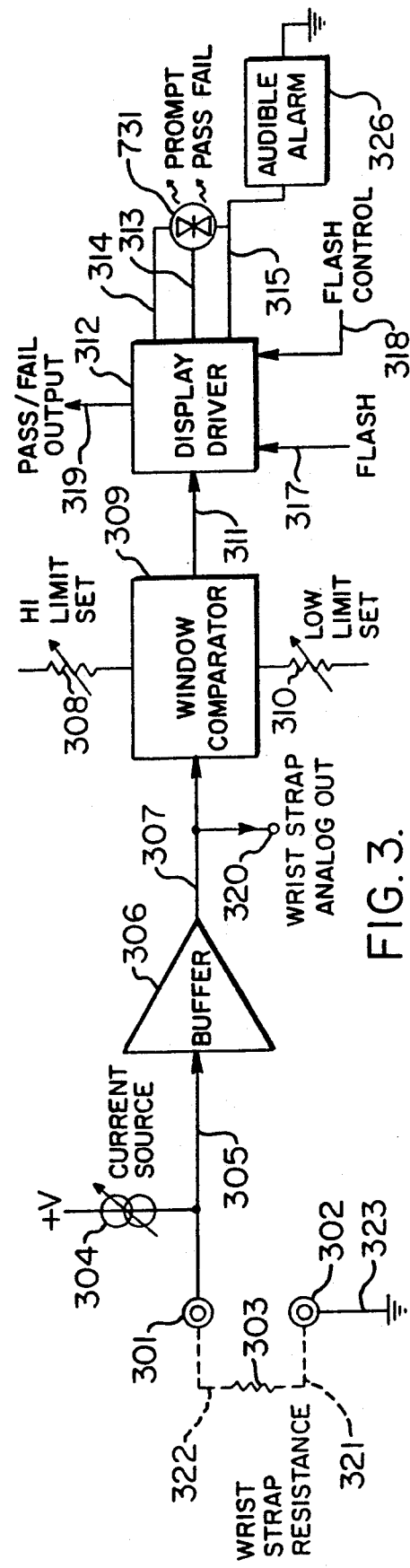

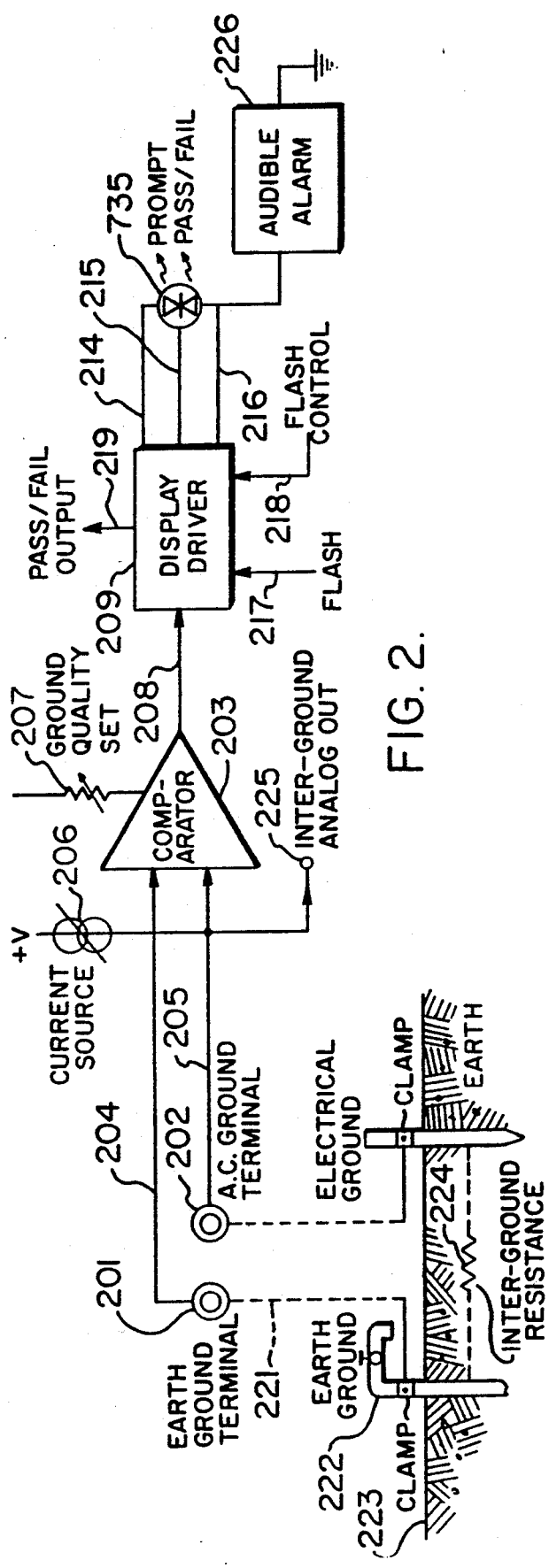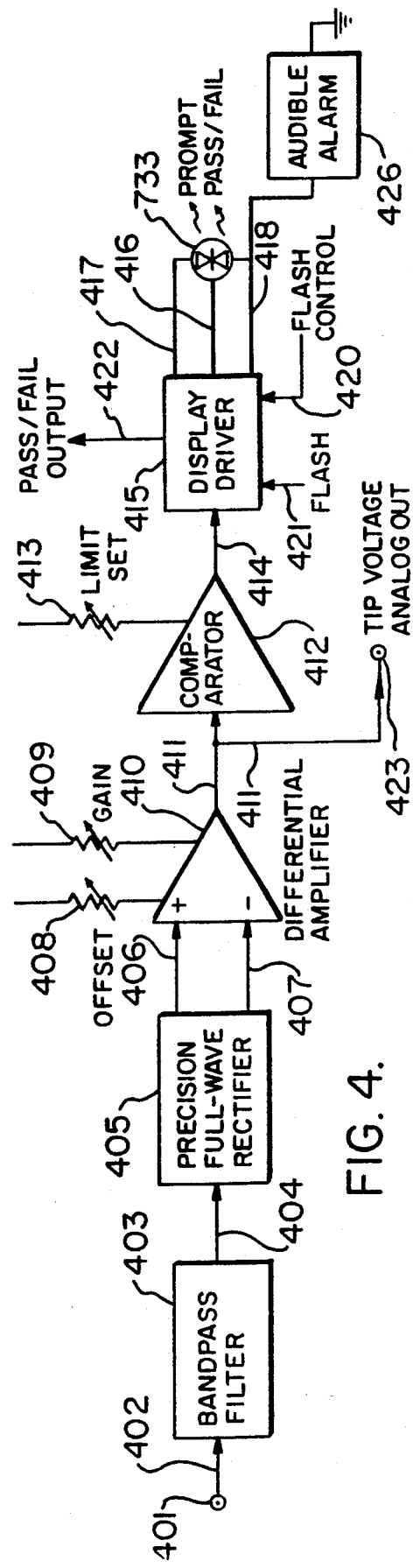

APPARATUS FOR MONITORING AND CONTROLLING ELECTROSTATIC DISCHARGE

This is a continuation of application Ser. No. 07/204,216, filed June 7, 1988, now abandoned.

FIELD OF THE INVENTION

This invention relates to electrostatic discharges and, in particular, to apparatus for automatically monitoring and controlling electrostatic discharge control systems to eliminate uncontrolled electrostatic discharge in a testing, manufacturing, laboratory, industrial or any other environment, where electrostatic discharge damage is a concern.

PROBLEM

It is a problem in the field of electrostatic discharge control systems to accurately and reliably guarantee the continued integrity of various static control measures used in an electronic circuit manufacturing or testing environment. It is well known that static electricity can cause substantial damage to semiconductors and integrated circuits. It generally takes as little as 100 to 500 volts of static electricity to destroy or damage an integrated circuit. In a dry climate, where humidity is 20 percent or less, a person can easily build up a static electric charge of 30,000 volts by simply walking across a carpeted area. Even in a high humidity environment, a person can build up static electric charge of 500 to 2,000 volts by walking across a tiled floor. Therefore, it is very easy for a person to build up a static electric charge of sufficient magnitude to destroy or damage an integrated circuit.

The type of damage caused to an integrated circuit by electrostatic discharge is of two types. The first type of damage is the destruction of the integrated circuit caused by the static electric charge discharging into the integrated circuit and causing part or parts of the integrated circuit to become completely inoperative. If this damage occurs during the manufacturing process of a printed circuit board, it is typically detected in the factory during the testing phase of that printed circuit board. The second type of damage is significantly more costly because it is the latent type of damage to the integrated circuit. That is, part or parts of the integrated circuit becomes over stressed due to the electrostatic discharge but the printed circuit board still meets minimum performance requirements. Therefore, if the damage occurs during the assembly process of the printed circuit board, the printed circuit board will pass all the manufacturing tests in the factory but will fail within a relatively short period of time after being placed in use due to the damage caused by the electrostatic discharge. Field service costs are significantly higher than in-factory correction of manufacturing faults. Therefore, it is important to prevent the destruction or damage to integrated circuits caused by electrostatic discharge in a manufacturing or testing environment.

There are a number of existing electrostatic discharge control systems that are used to minimize the occurrence of electrostatic discharge into integrated circuits in the manufacturing or testing of printed circuit boards or assemblies that incorporate semiconductors and integrated circuitry. One such electrostatic discharge control system is the grounding of the factory workers that handle the integrated circuits and the printed circuit boards. This grounding can be accomplished in one of several ways. One method of grounding workers in the factory environment is to construct the floor to incorporate conductors therein or to coat the floor with a conductive wax so that the entire floor of the factory can be grounded to form a ground plane. The workers are then connected to this ground plane by the use of electrically conductive straps that are connected to the workers' ankles and footwear to make electrical contact with the electrically conductive floor to thereby ground the workers as they move about the work place. A difficulty with such an arrangement is that as the worker moves around, ground contact with the floor can be broken thereby allowing an electrostatic charge to build up on the worker, which electrostatic charge can damage the semiconductors and integrated circuits that are handled by that worker.

A more effective method of grounding workers in a factory environment is the use of conductive wrist straps that are wired to a quality earth ground. A conductive wrist strap is connected to the worker's wrist and then connected via a coiled conductor to a ground located at the work bench or a piece of machinery that is the worker's work station. The difficulty with such an arrangement is that the worker is tethered to the work station by the coiled conductor and the range of motion of the worker is therefore severely limited by the use of the conductive wrist strap. As the worker moves around, the electrical connection from the conductive wrist strap to the work station can become entangled in the equipment in the work environment or the worker can accidentally pull the coiled conductor loose from its connection on the work station thereby breaking the electrically conductive path between the worker and electrical ground allowing an electrostatic charge to build up on the worker. Work stations with grounded conductive work surfaces, are also considered a standard requirement as means of discharging any source of static electricity placed on the work station surface.

Another source of potential damage for the integrated circuits in the manufacturing environment is the use of an ungrounded or defective soldering iron. A typical ungrounded soldering iron can generate 200 volts A.C. peak at the tip of the soldering iron. If the soldering iron is controlled by an SCR circuit, a voltage of greater magnitude can be generated. Soldering irons are now designed to have the tip of the soldering iron connected to ground to prevent the generation of such A.C. voltages.

While all of the above described measures have been somewhat effective in minimizing electrostatic discharge damage to semiconductors and integrated circuits, there is no assurance of the continued integrity of any one or combination of these static control measures. When, for example electrical connectivity of the wrist straps or the ankle straps are broken or the soldering iron malfunctions, there is no unified way to effectively detect the occurrence of such failures. While equipment is available to perform tests to verify the integrity of these static control measures, these tests are manually oriented in that they must be initiated by the worker and completed by the worker on a fairly regular basis. There presently is no automated or continuous monitoring of the integrity of a full static control system. Furthermore, the existing tests performed to verify the operability of soldering irons and the integrity of the static control measures are limited in their scope and content.

SOLUTION

The above problems are solved and a technical advance achieved in the field by the apparatus for monitoring and controlling electrostatic discharge control systems of the present invention. This apparatus provides an automated sequence of electrostatic discharge control and soldering iron performance measurements that can be used to verify the continued integrity of electrostatic discharge control systems. This is accomplished by a computer controlled central data acquisition and control unit that controls a plurality of test units. Each work station in the manufacturing environment is equipped with a test unit that performs a number of measurements and tests of various electrostatic discharge control systems and soldering iron performance. The central data acquisition and control unit sequentially and automatically polls each individual test unit to perform or prompt the work station operator to perform the designated measurements. The data obtained by each test unit is transferred to the central data acquisition and control unit where the data is analyzed and recorded. This data can be used to generate an alarm when one of the test units indicates a failure of the associated electrostatic discharge control systems or the soldering iron operation. In addition, the collected data provides an on-going record of long-term performance of the electrostatic discharge control systems and the individual soldering irons at each test unit.

The central data acquisition and control unit is a programmable apparatus that can automatically activate a test unit to perform an automatic test independent of the worker at the work station or signal the worker at the work station to participate in a test routine. The frequency of the tests and the sequence of test operations performed are all programmable in the central data acquisition and control unit so that the test sequence is adaptable to the needs of the particular testing or manufacturing environment. In addition, each test unit is adaptable to provide either pass/fail indications with preset threshold limits and/or to provide a human readable output indicative of the actual quantity measured in each test that is performed. Thus, the programmability and adaptability of this system enables the apparatus for monitoring and controlling electrostatic discharge control systems to be utilized in various testing or manufacturing environments as the needs of the environment dictate.

In addition, each test unit is designed to perform a plurality of tests and measurements. A number of these tests and measurements are well-known, state of the art operations that are performed in an improved fashion. Several of these tests and measurements are new to the field and consist of the measurement of the actual temperature at the tip of the soldering iron as well as the stability of the temperature control of the soldering iron unit. In addition, an accurate measurement of the resistance from the tip of the hot soldering iron to ground is performed. Thus, the test unit provides improved and additional functionality that, under control of the central data acquisition and control unit, provides a reliable way of verifying the continued integrity of the electrostatic control systems and soldering iron performance.

Each test unit includes a continuity test circuit for monitoring the quality of the electrical ground and the earth ground used for electrostatic discharge control. This is accomplished by measuring the loop resistance between electrical ground and earth ground and comparing the measured loop resistance with a preset adjustable threshold value. In the event that this impedance increases above the predetermined threshold value, the test unit activates an indicator to alert the worker that there is a loss of continuity. The test unit also stores data indicative of the result of this test in a buffer memory for subsequent retrieval by the central data acquisition and control unit.

The test unit also includes a conductive wrist strap test circuit to either periodically or continuously monitor the resistance of the wrist strap used by the worker at the work station. With a conventional conductive wrist strap, the worker periodically touches the wrist strap to a test point on the test unit in order to measure the wrist strap resistance. With a two-wire conductive wrist strap, the test unit continuously measures the resistance of the conductive wrist strap. In either case, the test unit compares the measured resistance with a predetermined adjustable range of values to insure proper operation of the conductive wrist strap. In the event the measured resistance is either above or below the predetermined range of values, the test unit activates an indicator arrangement to alert the worker that the wrist strap has failed. The result of this test is also stored in a buffer memory for subsequent retrieval by the central data acquisition and control unit to determine whether there has been a failure of the conductive wrist strap at this work station.

The failure of only one of the two wires of a two-wire wrist strap, will imitate an alarm and failure signal, yet the operator is still grounded with the remaining wire and therefore safe. The two-wire wrist strap is therefore superior to and preferred over a single wire wrist strap.

The test unit also is responsive to periodic manual testing of the tip of the soldering iron to detect whether an induced A.C. voltage on the tip of the soldering iron exceeds a predetermined A.C. voltage threshold. This test is performed by having the worker touch the tip of the soldering iron to an electrically conductive test point on the test unit where a measurement is performed by taking the value of the A.C. voltage on the tip of the soldering iron and extracting an equivalent RMS value within a limited bandwidth. If the A.C. voltage on the tip of the soldering iron exceeds a predetermined adjustable A.C. voltage threshold then the test unit activates an indicator to alert the worker that the soldering iron has failed to meet specifications. In addition, the results of this test are stored in a buffer memory for subsequent retrieval by the central data acquisition and control unit.

The test unit also measures the tip to ground resistance of the hot soldering iron. The measured resistance is again compared with a predetermined adjustable threshold to indicate whether the soldering iron is functioning properly. If the soldering iron fails this test, the test unit provides an indication to the worker. In addition, the results of this test are stored in a buffer memory for subsequent retrieval by the central data acquisition and control unit.

A further test is performed by the test units, of the soldering iron tip temperature and temperature stability. The measurement is performed by having the worker touch the tip of the soldering iron to a thermally conductive test point on a replaceable test head that plugs into the test unit. A thermocouple in the replaceable test head measures the absolute value of the temperature of the tip of the soldering iron in real time. This measured temperature is processed through a peak-minus-valley detector that determines the temperature variations of the tip of the soldering iron over a predetermined time period. Both the temperature and temperature stability of the tip of the soldering iron are compared to adjustable predetermined thresholds to provide a determination of whether the temperature control circuit in the soldering iron unit is functioning properly. As with all the above tests, the test results are stored in a buffer memory in the test unit for subsequent retrieval by the central data acquisition and control unit.

This architecture of the apparatus for monitoring and controlling electrostatic discharge systems thereby provides a centralized verification of the integrity of various electrostatic discharge control systems, soldering irons and other equipment throughout the manufacturing environment. This apparatus provides the flexibility to perform any sequence of tests with any reasonable frequency to measure the above-described parameters within adjustable ranges of values. The data obtained from these tests are stored in the central data acquisition and control unit for analysis and use in report generation. In addition, the tests performed by this apparatus provide a greater variety and precision of measurements to verify the integrity of the electrostatic discharge control systems. These and other features and objects of this invention will become apparent by reading the following disclosure.

BRIEF DESCRIPTION OF THE DRAWING

FIG. 1 illustrates in block diagram form the system architecture of the apparatus for monitoring and controlling electrostatic discharge control systems;

FIGS. 2 through 7 illustrate in additional detail the circuitry included in each test unit to perform the various tests and measurements of the static control functions and soldering iron performance.

DETAILED DESCRIPTION OF THE DRAWING

Figure 5:
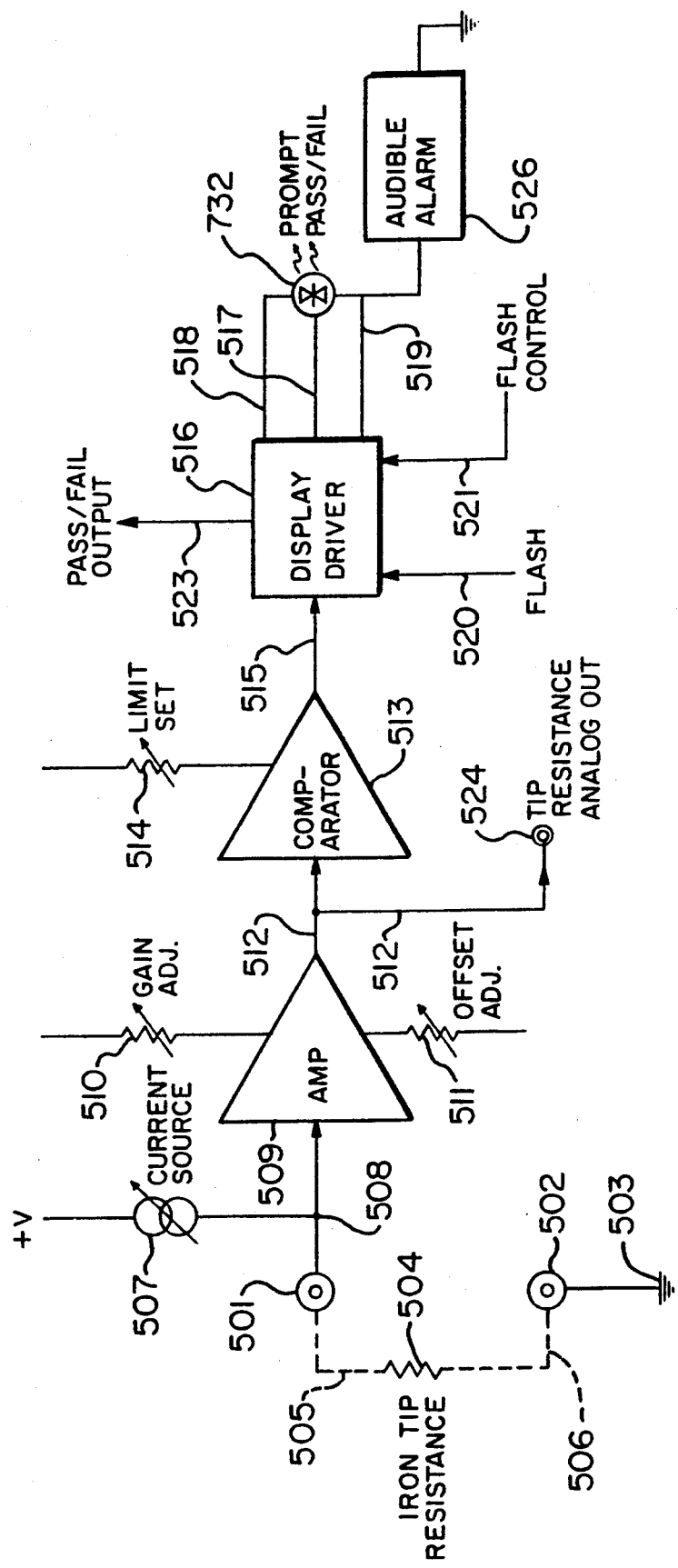
Figure 6:
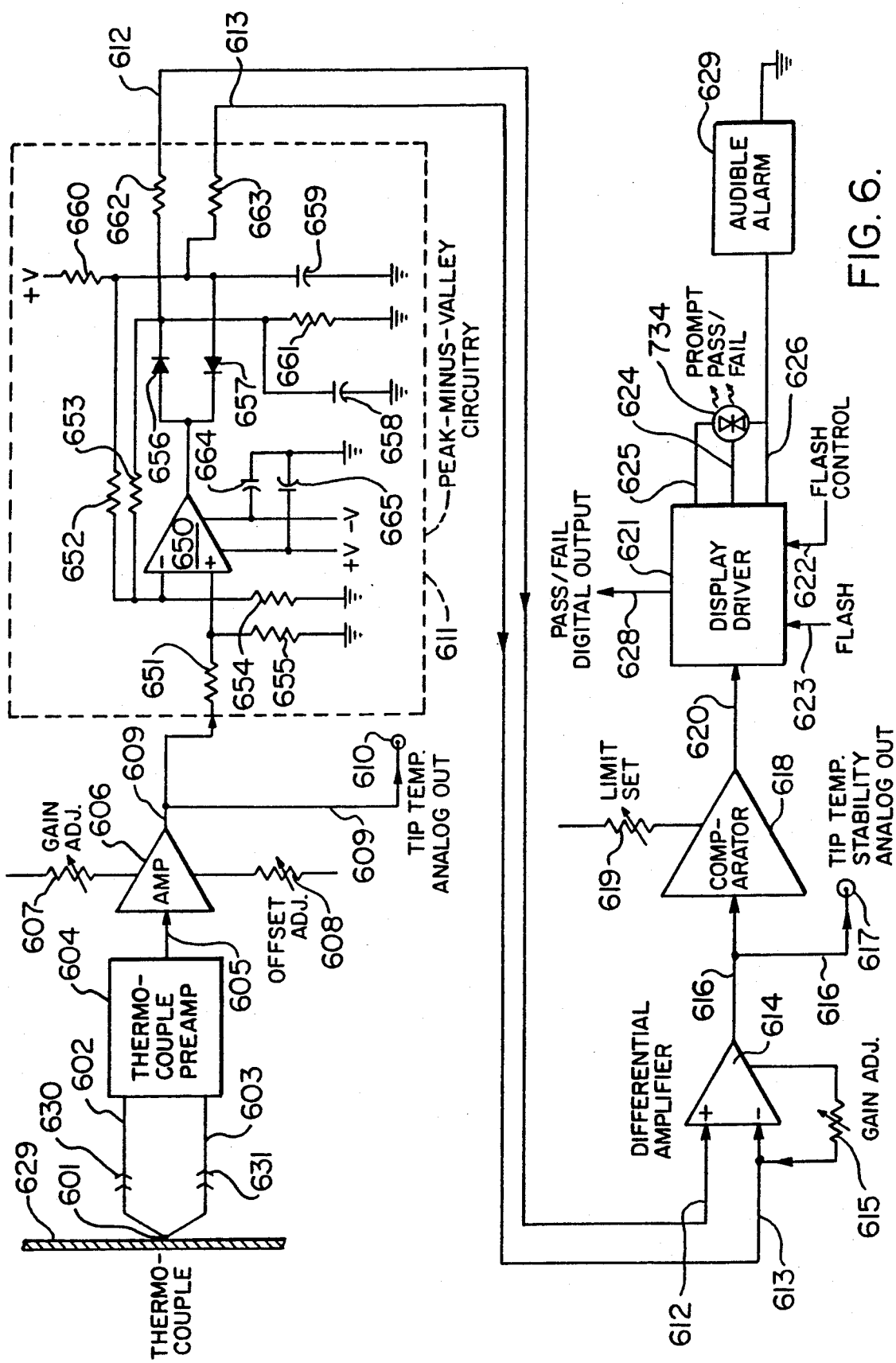

The apparatus for monitoring and controlling electrostatic discharge control systems provides an automated sequence of electrostatic discharge control and soldering iron performance measurements that can be used to verify the continued integrity of electrostatic discharge control systems. This is accomplished by a computer controlled central data acquisition and control unit that controls a plurality of test units. Each work station in the manufacturing environment is equipped with a test unit that performs a number of measurements and tests of various electrostatic discharge control systems and soldering iron performance. The central data acquisition and control unit sequentially and automatically polls each individual test unit to perform the designated measurements. The data obtained by each test unit is transferred to the central data acquisition and control unit where the data is analyzed and recorded. This data can be used to generate an alarm when one of the test units indicates a failure of the associated electrostatic discharge control systems or the soldering iron operation. In addition, the collected data provides an on-going record of long-term performance of the electrostatic discharge control systems and the individual soldering irons at each test unit.

The central data acquisition and control unit is a programmable apparatus that can automatically activate a test unit to perform an automatic test independent of the worker at the work station or signal the worker at the work station to participate in a test routine. The frequency of the tests and the sequence of test operations performed are all programmable in the central data acquisition and control unit so that the test sequence is adaptable to the needs of the particular testing and manufacturing environment. Each test unit is adaptable to provide the worker with pass/fail indications with preset, adjustable threshold limits and to provide a human readable output indicative of the actual quantity measured in each test that is performed. In addition, each test unit can transmit the pass/fail indications or data indicative of the actual quantity measured to the central data acquisition and control unit. Thus, the programmability and adaptability of this system enables the apparatus for monitoring and controlling electrostatic discharge control systems to be utilized in various testing and manufacturing environments as the needs of the environment dictate.

SYSTEM ARCHITECTURE

FIG. 1 illustrates in block diagram form the system architecture of the apparatus for monitoring and controlling electrostatic discharge control systems. Included in this apparatus is central data acquisition and control unit 100 which is a microprocessor controlled unit operating under software control to regulate the operation of a plurality of test units indicated on FIG. 1 as 122-1 to 122-20. Central data acquisition and control unit 100 is connected by cable 104 to adjunct computer 101 which is an auxiliary computer or data terminal that can be connected to the central data acquisition and control unit 100. This adjunct computer 101 includes a monitor 102 connected to adjunct computer 101 by cable 105 and an auxiliary printer 103 connected to adjunct computer 101 by cable 106.

Central data acquisition and control unit 100 includes control software that regulates the operation of the apparatus for monitoring and controlling electrostatic discharge systems. The control software is written in a commercially available programming language such as BASIC to thereby enable a user at adjunct computer 101 to modify or supplement this control software in a straight forward fashion. The control software defines a number of prearranged tests and test sequences to regulate the operation of the test units 122-1 to 122-20 and collect test data. The control software includes report programs to analyze the collected data and output the test data in predefined report formats for the user. The report formats can be customized by the user via adjunct computer 101 to thereby output the collected data in a form to match the needs of the user.

Central data acquisition and control unit 100 is connected via a plurality of conductors 107 to various ones of test units 122. For the sake of simplicity, only one group of test units 122-1 to 122-20 are shown connected to central data acquisition and control unit 100. In this preferred embodiment, 20 test units 122-1 to 122-20 are shown connected via a multiconductor cable (BUS) 107-1 to central data acquisition and control unit 100. It is apparent from this architecture that additional groups of test units can be connected by other ones of conductors 107 to central data acquisition and control unit 100 for expansion purposes. In the preferred embodiment, up to 20 test units are connected to each multiconductor cable 107-1. A maximum of 3600 test units, 122, may be controlled via additional strings 107, by a single central data acquisition and control unit 100, fully populated with one plug-in central processor card and nine (9) plug-in digital input/output control cards.

The interconnection of the test units to central data acquisition and control unit 100 is accomplished by the use of digital interface 120-1 to 120-20. This digital interface may be internal or external to the associated test unit 122-1 to 122-20 and may in an expanded version, provide auxiliary inputs and output to control additional functions. Cable (BUS) 107-1 interconnects central data acquisition and control unit 100 with for example remote digital interface 120-20. Digital interface 120-20 serves to interface test unit 122-20 to central data acquisition and control unit 100. This is accomplished by digital interface 120-20 receiving address and control signals via cable (BUS) 107-1 from central data acquisition and control unit 100 and decoding these signals to determine whether central data acquisition and control unit 100 is transmitting control information to the associated test unit 122-20 or requesting that data be downloaded from test unit 122-20 to central data acquisition and control unit 100. Digital interface 120-20 may also include a plurality of auxiliary digital inputs and outputs 123-20 for the control of or interconnection to various additional equipment not described herein.

Central data acquisition and control unit 100 polls a specific one of the digital interfaces by transmitting an address on cable 107-1 identifying the one of digital interfaces 120-1 to 120-20 that is being selected by central data acquisition and control unit 100. For the purpose of this discussion, assume that central data acquisition and control unit 100 transmits address information on cable 107-1 to identify remote digital interface 120-1. Digital interface 120-1 is programmable in that it can be set to respond to a predefined address from central data acquisition and control unit 100. When the address is received by digital interface 120-1 via cable 107-1 the data on the data leads of bus 107-1 are downloaded by the digital interface 120-1. This data is typically control signals from central data acquisition and control unit 100 which control signals are indicative of measurements to be performed or data transfers to be accomplished between digital interface 120-1 and central data acquisition and control unit 100. Digital interface, 120-1 may be external to test unit 122-1 and communicate with test unit 122-1 over a cable, or may be located internal to test unit 122-1.

As can be seen from this architecture, central data acquisition and control unit 100 can interface with every test unit in the system on an individualized basis to activate selected test units to perform tests and measurements or to transfer data therebetween. A test unit can be disconnected for repair purposes without disrupting the operation of the remaining test units. All test sequences and test prompts are under software control and each of the tests can be programmed to be performed at different time intervals and in different sequences by central data acquisition and control unit 100. Thus, the test routines can be customized not only for the particular testing or manufacturing environment in which this system resides but also in different patterns for various combinations of work stations to meet the diverse needs of various sections of the testing or manufacturing facility. Central data acquisition and control unit 100 can control the number of test sequences per day and the start time of each test sequence. It also can control the time allotted for each test to be performed and request repeat tests when the results are inconclusive or a failure mode has been detected. The central data acquisition and control unit 100 also can provide reports output to the printer 103 or the monitor 102 to indicate which test units are active and in use as well as to provide data in various report formats such as number of failures per day, week, month or year or failure trends or other statistical report formats. These reports can provide an indication of the integrity of the various static control functions as well as the performance of the associated soldering iron units. The apparatus for monitoring and controlling electrostatic discharge control systems thereby provides a flexible and reliable system to minimize the possibility of damage to the semiconductors and integrated circuits that are being worked on by the workers at each of the work stations in the manufacturing environment.

In order to better understand the operation of this apparatus, a more detailed description of the functioning of a typical test unit will be described in order to provide an understanding of the measurements and tests that are performed by the test unit.

TEST UNIT FUNCTIONS

Figure 7:
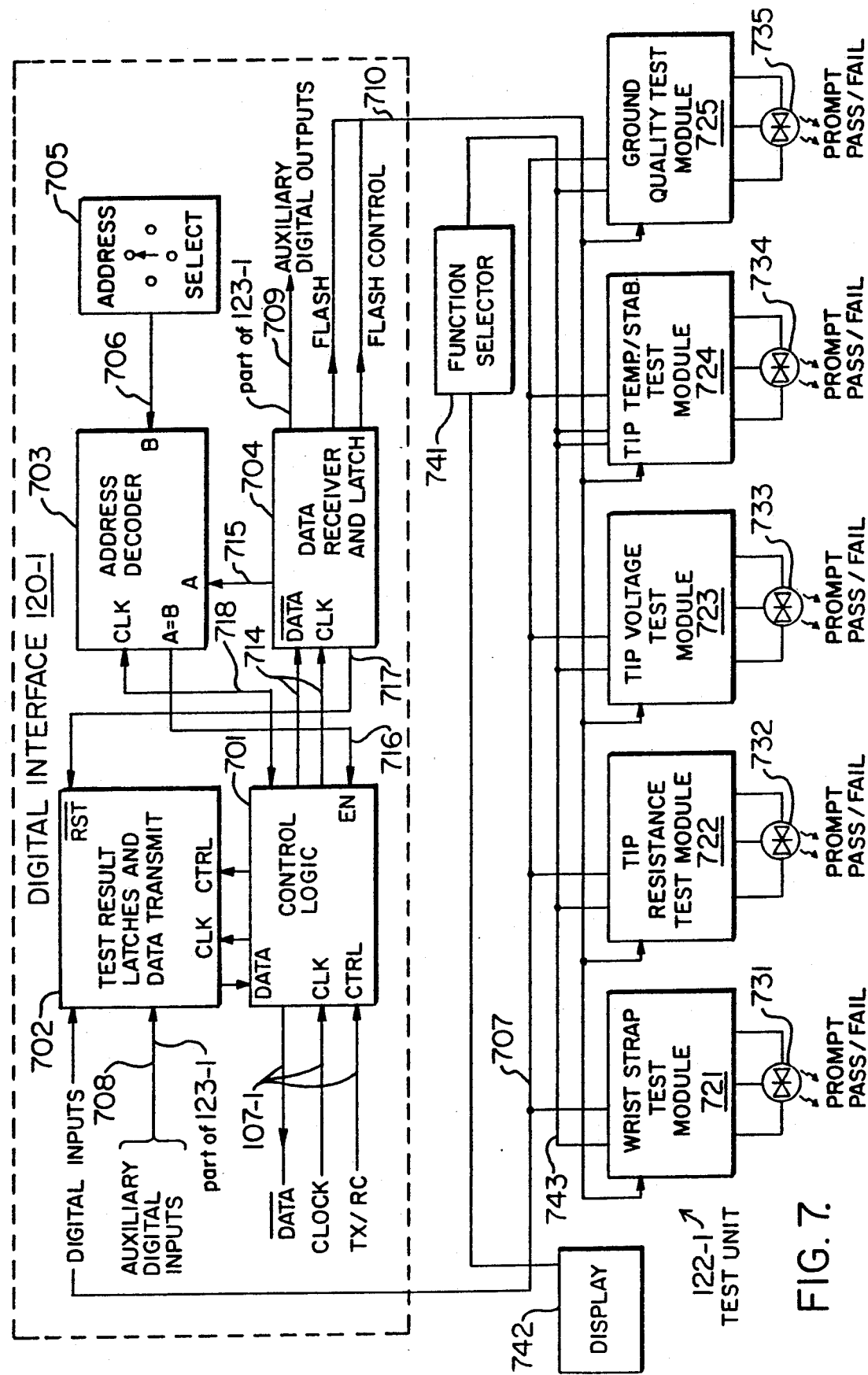

Each test unit is designed to perform a plurality of tests and measurements (see FIG. 7). A number of these tests and measurements are well-known, state of the art operations that are performed in an improved fashion. Several of these tests and measurements are new to the field and consist of the measurement of the actual temperature at the tip of the soldering iron as well as the stability of the temperature control of the soldering iron unit. In addition, an accurate measurement of the resistance from the tip of the hot soldering iron to ground is performed in the presence of interfering thermoelectric currents. Thus, the test unit provides improved and additional functionality that, under control of the central data acquisition and control unit, provides a reliable way of verifying the continued integrity of the electrostatic control systems and soldering iron performance. Various configurations of circuitry can be included in the test unit and the preferred embodiment disclosed herein illustrates only one possible configuration.

Each test unit includes a continuity test circuit 725 for monitoring the quality of the electrical ground and the earth ground used for electrostatic discharge control. This is accomplished by measuring the loop resistance between electrical ground and earth ground and comparing the measured loop resistance with a preset adjustable threshold value. In the event that this impedance increases above the predetermined threshold value, the test unit 122-1 activates an indicator 735 and an audible alarm 226 to alert the worker that there is a loss of continuity. The test unit 122-1 also stores data indicative of the result of this test in a buffer memory for subsequent retrieval by the central data acquisition and control unit 100.

The test unit 122-1 also includes a conductive wrist strap test circuit 721 to either periodically or continuously monitor the resistance of the wrist strap used by the worker at the work station. With a conventional conductive wrist strap, the worker periodically touches the wrist strap to a test point on the test unit in order to measure the wrist strap resistance. With a two-wire conductive wrist strap, the test unit continuously measures the resistance of the conductive wrist strap. In either case, the test unit compares the measured resistance with a predetermined adjustable range of values to insure proper operation of the conductive wrist strap.

In the event the measured resistance is either above or below the predetermined range of values, the test unit activates an indicator 731 and an audible alarm 326 arrangement to alert the worker that the wrist strap has failed. The result of this test is also stored in a buffer memory for subsequent retrieval by the central data acquisition and control unit 100 to determine whether there has been a failure of the conductive wrist strap at this work station 124-1.

The test unit 122-1 also includes a soldering iron tip voltage test module 723 that is responsive to periodic manual testing of the tip of the soldering iron to detect whether an induced A.C. voltage on the tip of the soldering iron exceeds a predetermined A.C. voltage threshold. This test is performed by having the worker touch the tip of the soldering iron to an electrically conductive test point on the test unit 122-1 where a measurement is performed by measuring the A.C. voltage on the tip of the soldering iron and extracting an equivalent RMS value within a limited bandwidth. If the A.C. voltage on the tip of the soldering iron exceeds a predetermined adjustable A.C. voltage threshold then the test unit 122-1 activates an indicator 733 and an audible alarm 426 to alert the worker that the soldering iron has failed to meet specifications. In addition, the results of this test are stored in a buffer memory for subsequent retrieval by the central data acquisition and control unit 100.

The test unit also includes tip resistance test module 722 that accurately measures the tip to ground resistance of the hot soldering iron in the presence of error causing thermoelectric currents, generated by the hot tip. The measured resistance is again compared with a predetermined adjustable threshold to indicate whether the soldering iron is functioning properly. If the soldering iron fails this test, the test unit 122-1 provides an indication 732 and an audible alarm 526 to the worker. In addition, the results of this test are stored in a buffer memory for subsequent retrieval by the central data acquisition and control unit 100.

A further test performed by the test units is the soldering iron tip temperature and temperature stability test 724. The measurement is performed by having the worker touch the tip of the soldering iron to a thermally conductive test point on the test unit 122-1. A thermocouple in the test point measures the absolute value of the temperature of the tip of the soldering iron in real time. This measured temperature is processed through a peak-minus-valley detector that determines the temperature variations of the tip of the soldering iron over a predetermined time period. The temperature stability of the tip of the soldering iron over a predetermined time period. The temperature stability of the tip of the soldering iron is compared to an adjustable predetermined thresholds to provide a determination of whether the temperature control circuit in the soldering iron unit is functioning properly. If the measurement exceeds the threshold, the test unit 122-1 activates an indicator 734 and an audible alarm 629 to alert the worker that the soldering iron unit is not functioning properly. As with all the above tests, the test results are stored in a buffer memory in the test unit 122-1 for subsequent retrieval by the central data acquisition and control unit 100.

Test unit 122-1 also includes a function selector 741 that enables the worker at the work station to manually select one of test modules 721-725 to read out the test results on display 742. Thus, the actual values of the performed measurements are availabe for readout on display 742. Function selector 741 selects the readout signal via cable 743 from the selected one of test modules 721-725 to drive the readout.

This architecture of the apparatus for monitoring and controlling electrostatic discharge systems thereby provides a centralized verification of the integrity of various electrostatic discharge control systems, soldering irons and other equipment throughout the manufacturing environment. This apparatus provides the flexibility to perform any sequence of tests with any required frequency to measure the above-described parameters within adjustable ranges of values. The data obtained from these tests are stored in the central data acquisition and control unit 100 for analysis and use in report generation. In addition, the tests performed by this apparatus provide a greater variety and precision of measurements to verify the integrity of the electrostatic discharge control systems.

DIGITAL INTERFACE

FIG. 7 illustrates in block diagram form circuitry that typically would be used to implement digital interface 120-1. This circuitry is interconnected with central data acquisition and control unit 100 via cable 107-1. Data, address and control signals are exchanged over cable 107-1 with central data acquisition and control unit 100. In operation, digital interface 120-1 is given a predefined address by setting switches illustrated as 705 on FIG. 7 to define one of twenty addresses that can be accessed via cable 107-1 by central data acquisition and control unit 100. The address selection switches 705 are connected via conductors 706 to an address decode circuit 703. When central data acquisition and control unit 100 signals digital interface 120-1, central data acquisition and control unit 100 outputs the address of digital interface 120-1 via cable 107-1. These address signals are received by control logic 701 and stored in data receiver and latch 704 via conductors 714. The stored address is then output over bus 715 to address decoder 703 where it is compared to the address defined by the switches 705. If there is a match between the address received over cable 107-1 and the address established by switches 705, address decoder 703 outputs a match signal on leads 716 to control logic 701.

This match signal indicates that digital interface 120-1 is the device that is being signalled by central data acquisition and control unit 100. The data signals that follow the address signals are then stored by control logic 701 in data receiver 704. This data can be auxiliary digital outputs to be used at the work station 124-1, which auxiliary digital outputs are output by data receiver 704 on conductors 709 which are a part of conductors 123-1. The data received can also be a request to activate one of the above-described tests in test unit 122-1. Data receiver 704 stores the data received from central data acquisition and control unit 100 and, under control of control logic 701, outputs flash signal and enable signals on conductor 710 to the ones of test modules 721-725 illustrated on FIG. 7 as part of test unit 122-1. Control logic 701, under control of the signals received from central data acquisition and control unit 100, sequentially activates the designated tests by activating various ones of the enable leads 710 to the various test modules 721-725. Control logic 701 also reads data indicative of the results of these tests output by the test modules 721-725 over bus 707 from test result latches in 702 where this data is stored. Test result latch 702 also stores data received from the auxiliary digital inputs of work station 124-1 over conductors 708. The results of all the tests that are sequentially performed by test unit 122-1, and stored in test result latches 702 are output by control logic 701 over bus 107-1 to central data acquisition and control unit 100.

EARTH AND ELECTRICAL GROUND QUALITY TESTS

FIG. 2 illustrates additional circuit details of the ground quality test module 725 that is part of the test unit 122-1. The ground quality test circuit 725 continuously monitors the quality of the electrical ground and the earth ground used as part of the electrostatic discharge control system. The test unit 122-1 is typically placed on a work station 124-1 that has a conductive surface and associated electrical outlets. Ground quality test circuit 725 is connected through the power cord of the test unit 122-1 to A.C. ground terminal 202 which is part of one of the outlets at the work station 124-1. The ground quality test circuit 725 also receives earth ground over terminal 201 which is connected by electrical cable 221 to an earth ground such as water pipe 222 that is inserted in the earth 223. Cable 221 is preferably a heavy gauge wire such as 14 to 18 gauge wire which is run to the water pipe 222, where it is clamped in conventional fashion to the water pipe for ground purposes. the ground quality test circuit 725 measures the interground resistance shown schematically on FIG. 2 as resistor 224. Resistor 224 is the resistance between earth ground and the electrical ground of the wiring systems that are used for the work stations.

The measurement of resistance 224 is accomplished by the use of comparator 203 and a test current applied by current source 206 to lead 205. The current received on lead 205 enters A.C. ground terminal 202 and is passed by the wiring system through interground resistance 224 to earth ground. This test current thereby produces a voltage potential across terminals 201 and 202 which is measured by comparator 203. Adjustable resistor 207 is used to adjust the threshold used by ground quality test circuit 725 to determine whether an adequate earth ground and electrical ground is available at the work station. The adjustable resistor 207 defines a predetermined interground resistance value which is adjustable for example between a few ohms and 125 ohms to define the required maximum interground resistance 224 that is permissible. Comparator 203 uses the reference value set by adjustable resistor 207 to determine whether the measured interground resistance 224 is in excess of the predetermined maximum threshold interground resistance defined by adjustable resistor 207. The result of this comparison is output on lead 208 to display driver 209. Display driver 209 includes a memory that stores the results of the comparison performed by comparator 203. Display driver 209 is connected by leads 214, 215 and 216 to two-color (example—green and red) light emitting diode 735. The contents of memory in display driver 219 are used to provide a signal on either lead 214 or 216 to activate the green pass indication of light emitting diode 735 or the red/fail indication of light emitting diode 735 respectively. The fail indication on lead 216 also activates audible alarm 226. In addition, the contents of the memory are output on lead 219 so they can be read by digital interface 120-1. An analog output signal is also provided on terminal 225, which signal is indicative of the measured interground resistance. This measured value can be converted by an analog-to-digital converter and output to a digital display device or to remote digital interface 120-1. Thus, the ground quality test circuit 725 can measure the actual interground resistance and provide a visual digital readout indicative of the actual measured interground resistance, and also provides a digital output indicative of the result of the comparison against the predetermined and adjustable interground threshold value, set by adjustable resistor 207. Both the pass/fail signal and the actual interground resistance value may be transmitted to data acquisition and control unit 100.

CONDUCTIVE WRIST STRAP TEST

In order to prevent the buildup of electrostatic charge on the worker at the work station, the worker is typically electrically attached to the work station's earth ground by a conductive wrist strap strapped onto the wrist of the worker and interconnected over a coiled conductor to test unit 122-1. This connection is illustrated schematically on FIG. 3 by the dotted line 321 showing the connection of the conductive wrist strap which has a certain amount of resistance 303 being connected by the cable 321 to the terminal 302 on test unit 122-1 to earth ground 323. The conductive wrist strap worn by the worker can be one of two types. One type is a single segment unit that wraps completely around the worker's wrist and is connected by single wire 321 to test unit 122-1. Another type of conductive wrist strap is a two segment conductive wrist strap which wraps around the wrist of the worker but consists of two electrically conductive segments that are electrically isolated from each other. One of these segments is connected via conductor 321 to terminal 302 of test unit 122-1 while the other segment is connected via conductor 322 to terminal 301 of test unit 122-1. In the single segment conductive wrist strap embodiment, the worker must touch the conductive wrist strap to terminal 301 to make electrical connection to test unit 122-1 to perform the conductive wrist strap resistance test. In the two segment conductive wrist strap case, test unit 122-1 can continuously monitor the conductive wrist strap resistance since there are two connections from test unit 122-1 to the conductive wrist strap. The two-wire wrist strap, therefore, has several strong advantages. Foremost among them is the fact that a failure is immediately detected and is not subject to the uncertainty period between each manual test. Another strong advantage is that even if one of the two wires or connections should break, the other one is almost certainly intact and the operator will remain grounded and therefore safe. Even if an alarm condition is registered due to the failure of one of the two wires, the operator is still grounded, and therefore, would not risk possible damage to PC boards or assemblies the operator was working on; however, since the alarm went off, the wrist strap may immediately be replaced well before a dangerous situation develops.

In either case, the conductive wrist strap 303 is connected across terminals 301 and 302 of conductive wrist strap test circuit 721 to measure the resistance between terminal 301 and earth ground.

For the single wire wrist strap, this test is initiated by digital interface 120-1 transmitting flash and enable signals to conductive wrist strap resistance test circuit 721 over leads 317, 318 respectively. These control signals cause display driver 312 to activate two color light emitting diode 731. Display driver 312 drives light emitting diode 731 using the flash signal so the light emitting diode 731 flashes in synchronization with the input flash signal to alert the worker at work station 124-1 to perform the conductive wrist strap resistance test by touching the wrist strap to terminal 301 on test unit 122-1. If a two wire wrist strap is used this test requires no interaction from the worker.

This measurement is accomplished by current source 304 providing a test current on conductor 305 to terminal 301 and conductor 322 to the two-segment conductive wrist strap or directly into the conductive wrist strap when the worker touches the single segment conductive wrist strap to terminal 301. The conductive wrist strap has an inherent impedance illustrated on FIG. 3 as resistor 303. The test current passes through resistance 303, through conductor 321 to terminal 302 to earth ground 323. The test current through the wrist strap resistance 303 thereby generates a voltage on conductor 305 which is transmitted by buffer 306 over conductor 307 to comparator 309. Comparator 309 is a high/low test circuit that determines whether the measured wrist strap resistance is between an upper and a lower threshold, i.e. within a window of allowable resistance values. The upper and lower thresholds are set respectively by adjustable resistor 308 and adjustable resistor 310. Thus, the adjustable resistors 308 and 310 can be set to varying upper and lower threshold limits to establish a variable window of allowable resistance. Adjustable resistor 310 sets the lower threshold and is adjustable for a typical range of values between 0 and 2 megohms. Adjustable resistor 308 can be set for the high limit which is typically a value between 1 and 11 megohms. Thus, window comparator 309 determines, based on the voltage generated on conductor 305, whether the wrist strap resistance 303 is within the range of values established by adjustable resistors 308 and 310.

The result of this comparison is output on conductor 311 to display driver 312 where it is stored in a memory. Display driver 312 provides a ground connection on lead 313 to a two color light emitting diode 731. The contents of the memory in display driver 312 are used to drive either lead 314 or lead 315 to activate the green/pass indication of light emitting diode 731 or the red/fail indication of light emitting diode 731 respectively. The fail indication on lead 315 also activates audible alarm 326. In addition, the contents of the memory are output on lead 319 so they can be read by remote digital interface 120-1. The analog voltage generated on lead 305 is output by buffer 306 over conductor 307 to terminal 320 to provide an analog signal indicative of the result of the wrist strap resistance test. This analog signal can be converted by an analog-to-digital converter into a digital signal which can be output to provide a numeric indication of the actual measured wrist strap resistance. This digital signal can be used to activate a display device to provide a readout to the worker at the work station or can be transmitted by digital interface 120-1 to central data acquisition and control unit 100.

VOLTAGE ON THE TIP OF SOLDERING IRON TEST

The work station typically is equipped with a grounded soldering iron for performing assembly work on the printed circuit board. If the tip of the soldering iron malfunctions or becomes ungrounded either due to corrosion or a broken ground wire, a high A.C. voltage can be induced on the tip of the soldering iron from the field surrounding the heating element. SCR controlled soldering irons are especially susceptible to this type of problem and voltage spikes of several hundred volts are not uncommon. Such a voltage can easily destroy semiconductor devices and integrated circuits.

In order to determine whether the tip of the soldering iron is adequately grounded, tip voltage test circuit 723 is illustrated on FIG. 4. This test requires the participation of the worker and is activated by digital interface 120-1 providing a flash signal on conductor 421 which signal is enabled by a control signal on lead 420 to activate display driver 415 to cause light emitting diode 733 to flash on and off at the rate determined by the signal on the flash input lead 421. Flashing light emitting diode 733 indicates to the worker at the work station 124-1 that the tip voltage test needs to be performed. This test is performed by the worker touching the tip of a hot soldering iron to a test point on the front of test unit 122-1 which is illustrated on FIG. 4 by terminal 401. Any voltage that appears on the tip of the soldering iron will be carried by terminal 401 and conductor 402 through a band pass filter 403 which filters out extraneous noise signals and places the resultant A.C. voltage on conductor 404 to a full wave rectifier 405. The full wave rectifier 405 generates an absolute value of the A.C. voltage by rectifying the A.C. signal into a positive and a negative value applied respectively over conductors 406 and 407 to differential amplifier 410, which extracts the equivalent RMS value of the measured AC voltage. A true RMS AC to DC converter circuit might also be used in place of the circuit described here. Adjustable resistors 408 and 409 are provided to adjust the offset and the gain respectively of differential amplifier 410. The resultant RMS value of the A.C. voltage is applied over conductor 411 to comparator 412 which compares this RMS value voltage with a limit established by adjustable resistor 413. A typical threshold value set by adjustable resistor 413 would be, for example, 2.0 millivolts. The result of the comparison between the measured A.C. voltage on the tip of the hot soldering iron and the threshold established by adjustable resistor 413 is output on lead 414 to display drive 415 where it is stored in memory. Display driver 415 provides a ground connection over conductor 416 to light emitting diode 733. The contents of the memory in display driver 415 are used to drive either lead 417 or 418 to provide respectively a green/pass signal from light emitting diode 733 or a red/fail signal from light emitting diode 733 respectively. The fail signal on lead 418 also activates audible alarm 426. The contents of the memory also provide an output signal on conductor 422 to provide a binary output to digital interface 120-1 indicative of the pass/fail status of the soldering iron tip voltage test. An analog signal generated by differential amplifier 410 and output on lead 411 to terminal 423 provides the actual measured soldering iron tip voltage which can be applied to an analog-to-digital converter and output in digital form to a display device, or transmitted by digital interface 120-1 to central data acquisition and control unit 100.

SOLDERING IRON TIP TO GROUND RESISTANCE

In addition to measuring the voltage that appears on the tip of the hot soldering iron, test unit 122-1 also measures the resistance from the tip of the hot soldering iron to its electrical ground. Such a test has heretofore been difficult to perform due to the thermoelectric current and voltage generated by making contact to the hot tip of the soldering iron. The thermoelectric effects swamp any accurate measurement that can be performed using commercially available test equipment, that employ low test currents. These low test currents are on the order of 1 to 10 milliamps and may produce measurement errors in excess of 50%. There is presently no commercial test equipment that can accurately measure the soldering iron tip to ground resistance due to the errors introduced by the thermoelectric current and voltage. This problem is overcome by using a high level current, as high as 0.5 ampere, as a test signal through the hot soldering iron, to essentially eliminate errors from thermoelectric current, in order to measure in accurate fashion the resistance between the tip of the hot soldering iron and its electrical ground. As the test current increases, these errors diminish since the relatively low thermoelectric currents are swamped by the much higher test current. A high test current also serves to burn open severely corroded wires and ground connections that may imminently fail. FIG. 5 illustrates the tip to ground resistance test circuit 722 in block diagram form.

The worker at the work station 124-1 is requested to perform this test by digital interface 120-1 applying a flash signal on conductor 520 to display driver 516 and simultaneously applying a strobe or enable signal on lead 521 to display driver 516 to thereby cause the flash signal appearing on lead 520 to activate light emitting diode 732 to flash on and off. The flashing of light emitting diode 732 is indicative to the worker to perform a tip to ground resistance test. This test is initiated by digital interface 120-1 under control of signals from central data acquisition and control unit 100. The worker in response to the flashing of light emitting diode 732 places the tip of the hot soldering iron on terminal 501 on test unit 122-1. This completes an electrical connection from soldering iron ground 503 to terminal 502 which is the ground terminal on the A.C. voltage receptacle on the front panel of test unit 122-1. Conductor 506 and resistor 504 are indicative of the electrical path through the soldering iron unit from the ground terminal of the A.C. receptacle to the tip of the hot soldering iron. This electrical connection is completed to terminal 501 of test unit 122-1 over path 505 by the worker touching the tip of the hot soldering iron to terminal 501. This action completes an electrical circuit that places the hot soldering iron in series with electrical ground between terminals 501 and 502.

A test current is generated by current source 507 in tip to ground resistance test circuit 722 and applied over conductor 508 to terminal 501. This test current is carried through the tip of the hot soldering iron and the circuitry of the soldering iron station to electrical ground 503. The current generated by current source 507 is typically on the order of 0.5 amps to thereby swamp out any signals that are generated as a result of the thermoelectric current and voltage generated by making contact with the hot tip of the soldering iron. The application of this test current to the soldering iron tip resistance 504 produces a voltage that is applied on lead 508 to amplifier 509. Adjustable resistors 510 and 511 adjust the gain and offset respectively of amplifier 509. Amplifier 509 outputs a signal on conductor 512 that is indicative of the soldering iron tip resistance 504 as a result of measuring the analog voltage produced on lead 508. The signal on lead 512 is used by comparator 513 to compare to a threshold set by adjustable resistor 514. A typical value for the allowable soldering iron tip resistance is 2.0 ohms and is adjustable within a certain range of values by adjustable resistor 514. The result of the comparison performed by comparator 513 is output over lead 515 to display driver 516 where this result is stored in a memory. Display driver 516 is connected by a ground connection on lead 517 to two color light emitting diode 732. The contents of the memory of display driver 516 are used to drive either lead 518 or 519 to activate the green/pass indication of light emitting diode 732 or the red/fail indication of light emitting diode 732 respectively. The fail signal on lead 519 also activates audible alarm 526. In addition, the contents of this memory are output on lead 523 so that they can be read by digital interface 120-1. An analog output signal is also provided by connecting the output of amplifier 509 by a conductor 512 to terminal 524. The analog signal appearing on terminal 524 is indicative of the measured resistance of the soldering iron tip. This measured value can be converted by an analog-to-digital converter and output to a digital display device or to digital interface 120-1, for transmission to central data acquisition and control unit 100.

ABSOLUTE TIP TEMPERATURE MEASUREMENT AND TEMPERATURE STABILITY MEASUREMENT

Digital interface 120-1 can prompt a soldering iron tip temperature and stability test to be performed with test circuit 724, by providing a flash signal on conductor 623 and an enable signal on conductor 622 to apply the flash signal to display driver 621. Display driver 621 in response to the received flash and enable signals on conductor 623 and 622 respectively causes two color light emitting diode 734 to flash on and off at the rate determined by the flash signal on conductor 623. The flashing of light emitting diode 734 causes the worker at the work station 124-1 to place the tip of the hot soldering iron on touch surface 629 on test unit 122-1. This contact area provides a way of making thermal connection between test unit 122-1 and the tip of the hot soldering iron. Thermal conductivity is improved by the application of a small amount of solder between the contact area and the tip of the soldering iron so that a wetted thermal contact is obtained. Contact area 629 is thermally connected to a thermocouple 601 that is the temperature sensor used by the circuit 724. The contact area, 629 with the attached (welded) thermocouple 601 is made very small (typically less than ¼" square) to minimize thermal loading of the tip of the soldering iron and the assembly is constructed as a replaceable "test head". This test head plugs into connectors 630 and 631 which are connected by conductors 602 and 603 to preamplifier 604. Preamplifier 604 provides thermocouple cold junction compensation so that an accurate measurement is obtained from thermocouple 601 of the actual temperature of the tip of the hot soldering iron. Preamplifier circuit 604 contains the necessary gain circuitry to amplify the very small voltage produced by a type K thermocouple 601. This preamplifier circuit 604 also contains temperature sensitive circuits that simulate a thermocouple cold junction reference and, therefore, corrects for errors that otherwise would have been produced by variations in the ambient temperature. Preamplifier 604 does not compensate for the inherent non-linearities between the measured temperature and thermocouple output voltage. In this circuit these errors are minimized by centering these relatively minor non-linearities around the temperature range of interest. The output voltage from preamplifier 604, which is a nearly linear function of the temperature as measured by the type K thermocouple 601 is further amplified and scaled by quad operational amplifier 606. Adjustable resistors 607 and 608 provide gain and offset adjustment respectively for amplifier 606. With the proper gain and offset applied to amplifier 606, the output from this operational amplifier now becomes a nearly linear and easy to use voltage representation of the measured temperature. This output voltage is available at terminal 610 in the form of 0 to 10 volts and this 0 to 10 volts represents 0 to 1,000° F. This voltage can also be fed to a 10 to 1 voltage divider and is than available as a 0 to 1 volt output, also representing 0 to 1,000° F. The output at terminal 610 is used as the linear analog representation of measured temperature in the embodiment of the invention that employs analog to digital converters for transmission of actual measured temperature to central data acquisition and control unit 100. This output is also used to feed the optional digital readout 742 for an indication of absolute temperature. This optional readout 742 employs a three digit liquid crystal display, plugs into the top surface of the work station test unit and would typically read soldering iron tip temperature over the range of 400° F. to 999° F.

The 0 to 10 volt output which represents 0 to 1,000° F. and which is typically used to measure the more limited range of 400° F. to 999° F., reacts very quickly to any minor variations in measured tip temperature and very faithfully follows any cyclical increases or decreases in the average tip temperature. Most soldering irons control tip temperature by switching the heating element on and off in response to increasing or decreasing tip temperature. The average temperature of a typical soldering iron tip will cycle in temperature from as little as plus or minus 1° F. to more than plus or minus 50° F. These variations typically occur around an average temperature of 700° F.

The newly released and revised Department of Defense specifications DOD-2000 require that such tip temperature of acceptable soldering irons must vary less than plus or minus 10° F. around the set temperature. The set temperature may, of course, range anywhere from a little more than 400° F. to more than 800° F. for typical application in the electronic industry.

The purpose of the Peak-Minus-Valley-Hold Circuitry 611 is to extract the total variation of this set temperature over a predetermined time period regardless of what the absolute set temperature is, the only requirement being that this set temperature is within the typical measurement range of 400° F. to 999° F. With only slightly reduced accuracy, this circuitry is capable of measuring such small temperature variations over the absolute temperature range of 0 to 1,200° F.

PEAK-MINUS-VALLEY DECTECTOR

Peak-minus-valley detector 611 measures the maximum and minimum values of the temperature of the tip of the hot soldering iron over a predetermined period of time. This provides a measurement of the temperature regulation ability of the soldering iron to insure that the temperature of the tip of the soldering iron does not vary over too wide a range of values. Accurate control of the temperature of the tip of the soldering iron is required to prevent damage to the printed circuit board itself and to the integrated circuits that are attached to the printed circuit board. Peak-minus-valley detector circuit 611 monitors the signal on conductor 609 generated by amplifier 606 which signal is indicative of the instantaneous actual measured temperature of the tip of the hot soldering iron. Once the predetermined time period has elapsed, peak-minus-valley detector circuit 611 outputs signals on conductors 612 and 613 indicative of the maximum and minimum values respectively of the measured temperature of the tip of the hot soldering iron over a predetermined time period. Differential amplifier 614 in conjunction with adjustable gain resistor 615 convert the measured maximum and minimum values of the temperature of the tip of the hot soldering iron into a differential signal which is supplied on conductor 616. This differential signal on conductor 616 appears at terminal 617 as a measurement of the variability of the temperature of the tip of the hot soldering iron. The signal on terminal 617 can be converted by an analog-to-digital converter into a digital indication of the measured variability of this temperature and used to drive a display device or applied to digital interface 120-1 for transmission to central data acquisition and control unit, 100. The measured temperature variation applied on lead 616 is used by comparator 618 to compare to a predetermined threshold of allowable temperature variation as determined by adjustable resistor 619. The results of this comparison are output by comparator 618 on lead 620 to display driver 621 where the results are stored in a memory. Display driver 621 is connected by a ground lead 624 to two color light emitting diodes 734. Contents of the memory of display driver 621 are used to drive either leads 625 or 626 to provide a green/pass output of light emitting diode 734 or a red/fail output of light emitting diode 734 respectively. The fail signal on lead 626 also activates audible alarm 629. In addition, the contents of this memory are output on lead 628. Thus, this circuit can measure the absolute temperature of the tip of the soldering iron over a range of reasonable values. (For example, 400 degrees Fahrenheit to 999 degrees Fahrenheit) as well as the stability of the temperature at the tip of the hot soldering iron, which is typically established as a range of 20 degrees Fahrenheit variation as the permissible threshold.

DETAILED DESCRIPTION OF PEAK-MINUS-VALLEY DETECTOR

The analog signal version of the measured temperature which contains any fluctuations due to temperature variations, is fed from the output of amplifier 606 through resistor 651 into the non-inverting input of amplifier 650. This operational amplifier 650 is basically configured as a non-inverting unity gain amplifier. The gain of one is basically set by feedback resistors 652 and 653, both being one megohm, working against inverting input resistor 654 which is also one megohm. These resistors along with resistors 651 and 655, which forms a two to one attenuator, produces a gain of exactly one at the input to resistor 651 and as seen by amplifier 606.

This operational amplifier circuit 611, however, differs dramatically from a conventional unity gain amplifier in that the conventional single feedback resistor is split into two equal value resistors, 652 and 653 and isolated from the output of amplifier 650 by diodes 656 and 657. Since diodes only conduct in one direction, the result of this split feedback resistor circuit is that resistor 653 functions as a feedback resistor only on increasing signals and resistor 652 functions only on decreasing signals. A large capacitor 658 equal to 330 microfarads, is connected between ground and the junction of diode 656 and resistor 653. Similarly, another capacitor 659 equal to 330 microfarads, is connected between ground and the junction of diode 657 and resistor 652. Unlike capacitor 658, capacitor 659 is connected to the positive supply voltage through a large resistor 660 of one megohm and will be charged, in the absence of any input signal, to a voltage that is one diode potential greater than the output from amplifier 650. In actual operation, diode 656 and capacitor 658 functions as a peak holding circuitry in that diode 656 will conduct only on positive going excursions at the output of amplifier 650 and will charge capacitor 658 to a voltage that is equal to the largest peak voltage at the input of amplifier 650. Due to the large time constant of capacitor 658 and the parallel value of resistors 661, 662, 652 capacitor 658 holds the peak voltage it has been charged to for a relatively long period of time (typically less than one minute is required). This held peak voltage, which represents the largest peak temperature excursion, is measured by the thermocouple 601 at input of preamplifier 604 and is fed to the non-inverting input of differential amplifier 614 through resistor 663.

The voltage on capacitor 659 initially sits at a value which is one diode potential higher than the voltage at the output of amplifier 650. As the input to amplifier 650 cycles to voltages representing the largest and the smallest cyclical temperature of the tip of the soldering iron as measured by the thermocouple 601, diode 657 conducts when the output from amplifier 650 is one diode potential less than the charge potential on capacitor 659. As the input to amplifier 650 cycles between the minimum and maximum voltages that represent the minimum and maximum temperatures, as measured on the tip of the soldering iron, capacitor 659 is discharged to a voltage that is equal to the minimum, or valley voltage at the input of amplifier 650 which represents the minimum or the valley of the excursions in temperature as measured at the tip of the soldering iron. This voltage is fed to differential amplifier 614 through resistor 662. Since diodes 656 and 657 are inside the feedback loops, the very high open loop gain of amplifier 650, essentially eliminates error contributions from the diode potential of approximately 0.7 volts and the associated drift with temperature.

From the above, it becomes evident that the voltage across capacitor 658 represents the peak of any temperature variation in the tip of the soldering iron and that similarly the voltage across capacitor 659 represents the valley of any such temperature variations. Since these two voltages are fed to differential amplifier 614, which is configured as a differential amplifier, amplifier 614 will substract the valley temperature from the peak temperature and the output of differential amplifier 614, therefore, represents only the peak-minus-valley variations in temperature over time and not the absolute temperature. The gain of differential amplifier 614 is adjustable with variable resistor 615 and this gain is adjusted such that the output from differential amplifier 614 produces 100 millivolts per degree F. This output is available at terminal 617 and is used to feed the optional digital readout 742 and is also fed as analog representation of the temperature stability of the soldering iron, to an analog-to-digital converter, for transmission to the Data Acquisition and Control unit 100. The latter, of course, applies only to the embodiment of the invention, which transmits the actual analog readings to the Data Acquisition and Control unit 100, as opposed to the embodiment of the invention that only transmits a pass or fail signal to the Data Acquisition and Control unit 100.

The pass/fail decision is made by comparator 618 which receives an input into its non-inverting terminal from differential amplifier 614. The inverting input to comparator 618 is connected to the wiper of potentiometer 619 which supplies a trip reference voltage for comparator 618. As the specifications contained in the Department of Defense DOD-2000 require that soldering iron tip temperatures must not exceed variations of plus minus 10° F., or a total range of 20° F., and since the output from differential amplifier 614 is scaled to 100 millivolts per degree F. and this output is also the input to comparator 618, this output/input would represent 20° F. when it reaches a voltage of 2.0 volts. (0.1 volt×20° F.=2.0 volts). The reference trip voltage for comparator 618 is therefore set to a positive 2.0 volts potential with potentiometer 619. The output of comparator 618 will therefore be at or near ground potential when the output from differential amplifier 614 is less than 2.0 volts or less than a total of 20° C. temperature variation at the tip of the soldering iron. Similarly, the output from comparator 618 will be at or near plus 5 volts when the output from differential amplifier 614 exceeds 2.0 volts or a total temperature variation at the tip of the soldering iron of more than 20° F. A high level at the output of comparator 618 therefore indicates a failed soldering iron test, whereas a low level at the output of comparator 618 represents a good or passed soldering iron test. This digital pass/fail signal is fed to the pass/fail display driver 621 which has a flash control and flash enable input, both of which are fed from the digital interface circuitry which communicates with the Data Acquistion and Control unit 100. The flash input receives a slowly pulsing signal which pulses between 0 and approximately 5 volts, causing the pass/fail light, for the soldering iron test function, located on the front panel of the work station test unit to flash. The flashing of this light on command from the Data Acquisition and Control unit 100 prompts the work station operator to conduct the soldering iron temperature test. The work station operator accomplishes this test by touching the tip of the soldering iron to the test area of the plug-in temperature test-head located on top of the work station test unit, and maintaining this contact until the light ceases to flash. The instantaneous absolute temperature during this predetermined time period is available for readout on the optional three digit readout device and the maximum excursion in temperature or the total temperature variation is also available for readout, as selected by the front panel readout selector switch. In one embodiment, these analog signals are transmitted to the Data Acquisition and Control unit 100 for further processing. A pass/fail decision was also made by comparator 618 and a pass or fail signal is being sent to the display driver 621, which in turn activates either the green/pass or red/fail light 734 contained within the single pass/fail LED indicator, associated with the temperature test and located on the front panel of the test unit. Display driver 621 also transmits a pass/fail signal to digital interface 120-1, for processing and transmission to central data acquisition and control unit 100.

SUMMARY

Thus, this architecture enables central data acquisition and control unit 100 to address any specific one of the test units and to activate any combination and/or sequence of test operations at the addressed test unit. The frequency and duration of the tests are controllable at each test unit by program modification through adjunct computer 101. Thus, this apparatus is adaptable to perform any sequence of tests with any reasonable frequency to measure the above-described parameters within adjustable and customizable ranges of values. Test unit 122-1 can be prompted to perform for example, a soldering iron tip to ground resistance test and a ground quality test using a first set of thresholds, while test unit 122-2 can be subsequently activated to perform the same tests, while test unit 122-3 can be activated to perform, for example, a conductive wrist strap resistance test and a soldering iron tip temperature and stability test. It is anticipated that all test units will normally be sequentially prompted to perform all test functions at the same test intervals.

The use of a central data acquisition and control unit 100 also enables trends across various segments of the manufacturing environment or trends in a particular work station to be monitored and stored in memory, so that the data retrieved from the test units can be used to identify at an early stage any potential failures of the electrostatic discharge control systems or the associated soldering unit. Therefore, for example, if a particular soldering iron at work station 124-1 produces a measured tip temperature stability that decreases on every subsequent test, it is likely that the temperature control of the soldering iron is beginning to fail. The ever-increasing value of the measured temperature variation at this control unit can be analyzed by central data acquisition and control unit 100 to predict both the likelihood of failure and even the time that a soldering iron will fail. An alarm can be generated via monitor 102 or printer 103 to provide preventative maintenance so that this soldering iron can be removed from operation before it reaches the failure mode and causes damage to the integrated circuits and the printed circuit board at that work station. Thus, by providing a central data acquisition and control unit 100, data can be logged and analyzed to provide a record of the tests performed as well as to provide a more reliable electrostatic discharge control environment as well as control over the soldering irons used in the manufacturing environment.

The central data acquisition and control unit 100 is programmed in the BASIC interpretive language so that a user can program unique test sequences or modify the operation of the existing test sequences that are programmed in central data acquisition and control unit 100. In most cases, SpectraScan Inc., will provide prewritten software programs, that enable the user to make program changes in plain English, by selecting various functions from a number of menus appearing on monitor, 102. This programming or reprogramming is accomplished by the use of adjunct computer 101, which functions as an intelligent terminal. The user can write a program on adjunct computer 101 and download the program over data link 104 into central data acquisition and control unit 100. In a similar fashion, the data stored in central data acquisition and control unit 100 can be read by adjunct computer 101 over data link 104 for storage and analysis therein.

The auxiliary inputs and outputs provided by one embodiment of the digital interface 120-1 can be used for various other sensors or to control various other devices that are usable in this manufacturing environment to control electrostatic discharge or other related functions at the work station. This interface might, for example, be used to receive on/off data from ionizers or similar static control equipment or to shut off the entire work station by interrupting power to the work station when a work station fail signal is received by the test unit 122-1. Thus, central data acquisition and control unit 100 provides automated, precision control of the electrostatic discharge control systems distributed throughout the manufacturing environment.

CENTRAL DATA ACQUISITION AND CONTROL UNIT

Figure 8:
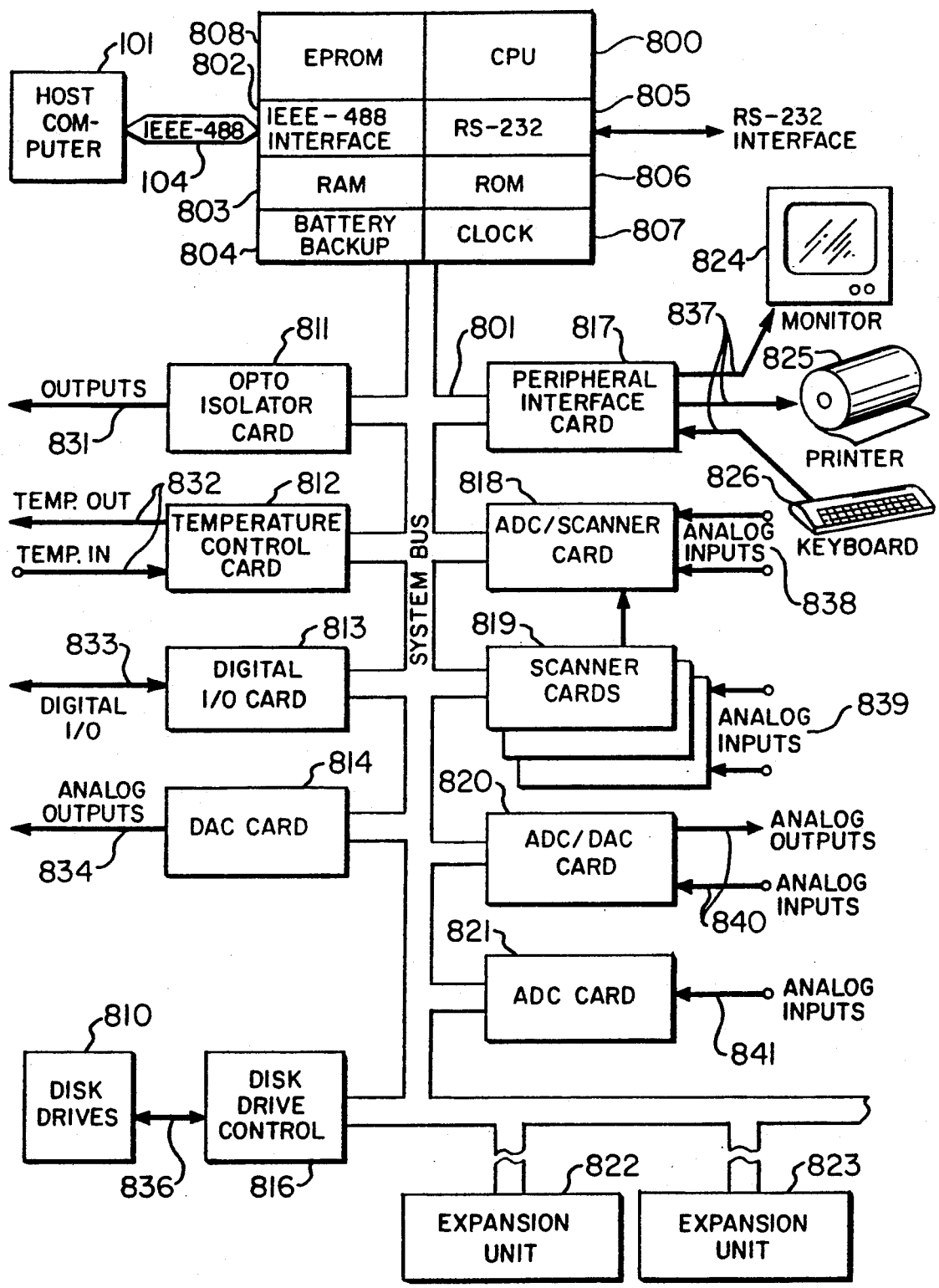
FIG. 8 illustrates additional detail of the circuitry of the central data acquisition and control unit.

FIG. 8 illustrates in block diagram form the architecture of central data acquisition and control unit 100. The central data acquisition and control unit 100 is a microprocessor based measurement and control system that is designed for factory automation, industrial control, data acquisition and automated testing. An example of a commercially available central data acquisition and control unit 100 is the DataScan R7-10 factory automation and data acquisition and control system that is manufactured by SpectraScan. The basic architecture of this commercially available unit is illustrated in FIG. 8 as part of the preferred embodiment of this invention.

Central data acquisition and control unit 100 includes a central processing unit 800 that consists of a microprocessor controller board that uses typically an 8088 microprocessor to control the overall operation of the central data acquisition and control unit 100. Associated with central processing unit 800 is a clock 807, battery backup 804, random access memory 803, read only memory 806, which may include an EPROM (erasable programmable read only memory) and two interface circuits 802, 805 for interconnecting central processing unit 800 to another processor, or computer. For example, interface 802 is an IEEE-488 type interface that interconnects central processing unit 800 via cable 104 to host computer 101. Interface 805 is an RS-232 interface that interconnects central processing unit 800 with for example another central processing unit 800 so that a plurality of central data acquisition and control units 100 can be interconnected. Interface 805 may also be used to connect to host computer 101 in lieu of interface 802. These interfaces, 802, 805, enable central processing unit 800 to communicate with a host computer, a remote terminal, another central data acquisition and control unit 100, or any other device that is compatible with either an IEEE-488 or RS-232 interface format.

Central processing unit 800 is connected by IBM compatible bus 801 to a plurality of input and output cards some of which are illustrated in FIG. 8. These input and output cards serve to perform a number of basic functions. One function is factory automation and industrial control which requires switching, controlling or monitoring of basic on/off signals or linear analog control signals. Another function is data acquisition and control wherein analog or digital signals must be measured or produced. To accomplish this, analog-to-digital converters and digital-to-analog converters are available along with multiplexer cards to scan and retrieve data from various remote locations. A final function is instrumentation wherein various sensors are monitored. The disclosed embodiment uses central processing unit 800 and one or more digital input/output modules to perform the basic functions described herein. In this embodiment there are nine slots for the digital input/output modules, each of which can control 20 strings of 20 test units for (9×20×20)=3600 test units.

A number of interface cards are illustrated in FIG. 8 in order to demonstrate the above described capabilities. Opto isolator card 811 interconnects system bus 801 with a plurality of signal leads 831 to provide isolated control of a plurality of on/off functions. Opto isolator card 811 include control registers (not shown) so that central processing unit 800 can load control bits via bus 801 into these control registers to activate the opto isolators on the opto isolator card 811. Additional data registers are provided on opto isolator cards 811 that enable central processing unit 800 to read data indicative of the status of each opto isolator on opto isolator card 811 via bus 801. Temperature control card 812 is connected via a plurality of control leads 832 to temperature sensors and temperature control devices. Temperature control card 812 generates and senses analog voltages for the purpose of measuring and controlling the temperature at various locations. Digital input/output card 813 is connected to a plurality of control leads 833 to perform a variety of tasks including control of on/off functions, identifying test fixtures, monitoring switch closures, and sensing system errors. The digital input/output card 813 consists of eight 8 bit bidirectional data ports and a control port. Each eight bit data port may be programmed as input or output depending on the setting of the control port by central processing unit 800. Thus, each port on this card can be programmed individually as an input or an output port. It is one or more of this digital input/output card 813, that is used to interface to, control, and receive data from each of the work station test units. Digital-to-analog converter card 814 is connected to a plurality of output leads 834 and is used to control voltage programmable devices or to generate output voltages to be transmitted to a remote device. Digital-to-analog converter card 814 consists of a plurality of 10 or 12 bit digital-to-analog converters each of which is programmable to generate a selected output voltage. The programming is accomplished by central processing unit 800 transmitting control signals over bus 801 to digital-to-analog converter card 814. Analog-to-digital converter card 821 is connected to a plurality of analog input leads 841 and is used to measure analog voltages that are applied to each of the analog input leads 841. Analog-to-digital converter card 821 includes a plurality of ten or twelve bit analog-to-digital converters that can be programmed via central processing unit 800. Unipolar or bipolar signals are applied to the plurality of analog signal leads 841. Analog-to-digital converter/digital-to-analog converter card 820 is connected to a plurality of bidirectional signal leads 840 and is used in applications when the generation of an analog voltage and the monitoring of a feedback signal is required in the closed loop mode. An example of such an application is temperature control or servo positioning. This card consists of one or more analog-to-digital converters, one or more digital-to-analog converters and bus interface circuitry to perform the bidirectional conversion function described above.

Analog-to-digital scanner card 818 and scanner card 819 are connected to a plurality of analog input leads 838, and 839 respectively. These two cards 818, and 819 can be used to measure a large number of analog voltages. It is prohibitively expensive to have one analog-to-digital converter for each analog input signal in the application where a large number of signals need to be measured. Therefore, the input signals are time multiplexed to a single analog-to-digital converter, located on ADC/scanner card 818 by way of analog multiplexers, which are a plurality of solid state switches. Additional scanner cards, 819, may be added in a daisy-chain fashion, for very large numbers of inputs. Thus, to measure the voltage on a particular one of the analog input leads 839, the analog switch for that input is turned on while all the other switches are turned off in scanner cards 819 and 818. The voltage on the analog-to-digital converter input on card 818 therefore becomes the voltage at this selected input lead. To measure all the input voltages, each individual switch in scanning ADC card 818 and one or more scanner cards 819 is successively turned on and off each time the analog-to-digital converter completes a measurement. A plurality of scanner cards 819 can be multiplexed to scanning analog-to-digital card 818, each scanning card 819, having 64 inputs, and, analog-to-digital scanner card 818 can monitor 32 individual inputs on leads 838.

Central processing unit 800 is equipped with random access memory 803, read only memory 806 and erasable programmable read only memory 808, for storing control programs thereon. In addition, central processing unit 800 can be connected by bus 801 to disk drive control 816 which interfaces central processing unit 800 with one or more disk drives 810 via bus 836. The use of a plurality of disk drives 810 enables the permanent storage of large quantities of data for report generation or record keeping purposes. The disk drive 810 can be the standard commercially available drive and $5\frac{1}{4}''$ double sided double density floppy disk drives used in personal computers. In addition, peripheral interface card 817 provides local control of central processing unit 800 through keyboard 826 while also providing human readable output on printer 825 or monitor 824, all through interface cables 837. The use of these peripheral devices is intended for applications where the capabilities of host computer 101 are not needed. To further expand the capabilities of this system, one or more expansion units 822, 823 can be provided to extend the capability of the system via bus 801, to interface to an additional 10 input and output control cards for each expansion unit. Thus, a high degree of flexibility and efficiency is available by this use of this modular design disclosed in FIG. 8. Although SpectraScan's "DataScan R7-10 Data Acquisition and Control System" offers this plurality of measurement and control plug-in modules, typically only one or more of the digital input/output plug-in modules 813 are required for this application. One DataScan unit, containing one central processing module and 9 digital input/output modules can control 3600 work station monitors.

CONTROL STRUCTURE

Central data acquisition and control unit 100 includes control software that is configured in three layers: machine language input/output drivers, BASIC interpreter, and applications programs. The machine language input-output drivers and the BASIC interpreter typically are stored in read only memory 806 in order to preserve the integrity of this software. The applications programs are typically stored in a random access memory 803 so that they can be modified as desired by the user of this system. The applications programs can alternatively be stored in read only memory 806 or erasable programmable read only memory (EPROM) 808 if it is important that these programs not be modified, or lost accidentally during power failure.

The machine language input/output software provides drivers or subroutine that enable the programmer to control the various plug-in modules described above. Control of these plug-in modules are accomplished by the use of simple CALL statements that are written in the BASIC programming language. There is a different driver subroutine for each plug-in module. The use of these standard machine language input/output drivers simplifies the programming required to implement the control function in a particular application.

The BASIC interpreter provides an easy to use programming language that a user can access to develop applications programs. The interactive BASIC programming language enables the user to perform processes, calculations, and program testing without having to write a detailed program. This interpreter includes a number of features: a program editor, the variables, arrays, scientific functions, various commands, statements and functions. The user generates an application program using this interpreter by first identifying the required steps to be performed by the central data acquisition and control unit. This list of functional steps is converted using the program editor into control or program statements that call various ones of the machine language input/output drivers to activate the input/output cards included in central data acquisition and control unit 100 to transmit control signals or monitor data signals from various devices controlled by central data acquisition and control unit 100. This program is input by the user using keyboard 826 or host computer 101 into for example random access memory 803. SpectraScan Inc. also offers to write special applications programs for the user, enabling the user to program the system in plain English, through menu selections on monitor 824.

For this application, central data acquisition and control unit 100 is typically equipped with a standard applications program which perform predefined control and reporting functions. The application program, typically would offer menus and submenus to enable a user to select status or to modify settings or limits by simply responding to prompts provided by central processing unit 800 on monitor 824. Thus, central data acquisition and control unit 100 can be a turnkey system with ready to use applications programs or it can be customized by a user through the use of the BASIC interpreter to perform whatever control and monitoring functions are required in a particular environment.

While a specific embodiment of this invention has been disclosed herein, it is expected that those skilled in the art, can design other embodiments that differ from this particular embodiment but fall within the scope of the appended claims.

I claim:

1. A test system for conducting a plurality of measurements at a plurality of test units, each of which is programmable to perform from one to a plurality of predefined measurements, comprising:
    central control means for regulating the operation of said plurality of test units;
    means connected to and interconnecting said central control means and said plurality of test units for exchanging control and data signals therebetween;
    each of said test units including:
        means programmable to perform from one to said plurality of predefined measurements on equipment connectable thereto, including means for determining the operational integrity of electrostatic discharge control systems connected to said test units,
    interface means connected to said exchanging means for providing an addressable interface to enable said central control means to access a single one of said test units;
    wherein said central control means includes:
        means for selecting each of said test units independent of every other one of said test units,
        means for programming said programmable means in each said selected test units to perform a set of said plurality of predefined measurements, which set is defined by said programming means for each of said selected test units.

2. The system of claim 1 wherein said interface means includes:
    means responsive to control signals received from said central control means via said exchanging means for transmitting data, indicative of the results of said selected measurements conducted by said performing means, to said central control means via said exchanging means.

3. The system of claim 1 wherein said determining means includes:
    means connected to earth ground and an electrical ground associated with said test unit for measuring the resistance between said earth ground and said electrical ground.

4. The system of claim 3 wherein said measuring means includes:
    means for displaying the value of said measured value of the resistance between earth ground and electrical ground.

5. The system of claim 3 wherein said determining means further includes:
    means for generating an alarm indication when said measured resistance between earth ground and said electrical ground exceeds a predetermined threshold.

6. The system of claim 5 wherein said generating means includes:
    means for producing an audible alarm indication when said measured resistance between earth ground and said electrical ground exceeds said predetermined threshold.

7. The system of claim 5 wherein said generating means includes:
    means for producing a green colored visual indication when said measured resistance between earth ground and said electrical ground is less than or equal to said predetermined threshold, a red colored visual indication when said measured resistance between earth ground and said electrical ground is greater than said predetermined threshold.

8. The system of claim 1 wherein said determining means includes:
    means for measuring the resistance of a conductive wrist strap used by a worker at said test unit.

9. The system of claim 8 wherein said measuring means includes:
    means for displaying the value of said measured wrist strap resistance.

10. The system of claim 8 wherein said determining means further includes:

means for generating an alarm indication when said measured resistance of said conductive wrist strap exceeds a predetermined threshold.

11. The system of claim 10 wherein said generating means includes:
means for producing an audible alarm indication when said measured resistance of said conductive wrist strap exceeds said predetermined threshold.

12. The system of claim 10 wherein said generating means includes:
means for producing a green colored visual indication when said measured resistance of said conductive wrist strap is equal to or less than said predetermined threshold, a red colored visual indication when said measured resistance of said conductive wrist strap is greater than said predetermined threshold.

13. The system of claim 8 wherein said determining means further includes:
means for generating an alarm indication when said measured resistance of said conductive wrist strap is less than a predetermined threshold.

14. The system of claim 13 wherein said generating means includes:
means for producing an audible alarm indication when said measured resistance of said conductive wrist strap is less than said predetermined threshold.

15. The system of claim 13 wherein said generating means includes:
means for producing a green colored visual indication when said measured resistance of said conductive wrist strap is equal to or greater than said predetermined threshold, a red colored visual indication when said measured resistance of said conductive wrist strap is less than said predetermined threshold.

16. A system for monitoring the operation of electrostatic discharge control equipment located at each of a plurality of test units, each of which is programmable to perform from one to a plurality of predefined measurements, said electrostatic discharge control equipment including a conductive wrist strap on the wrist of a user, comprising:
central control means for regulating the operation of said plurality of test units;
means connected to and interconnecting said plurality of test units and said central control means for exchanging control and data signals therebetween;
wherein each of said test units include a plurality of measuring means, each performing one of said predefined measurements to measure a parameter of said electrostatic discharge control equipment, said plurality of measuring means comprising:
means for determining the resistance of said conductive wrist strap,
means connected to earth ground and to an electrical ground associated with said test unit for continuously measuring the resistance between said earth ground and said electrical ground,
means, including a soldering iron test point, responsive to said user touching said soldering iron test point with the tip of a hot soldering iron for measuring the AC voltage appearing on said tip of the hot soldering iron,
means responsive to said user touching said soldering iron test point with said tip of said hot soldering iron for measuring the resistance between said tip of said hot soldering iron and the electrical ground connection of said hot soldering iron,
means responsive to said user touching said soldering iron test point with said tip of said hot soldering iron for measuring the absolute temperature of said tip of said hot soldering iron,
means responsive to said user touching said soldering iron test point with said tip of said hot soldering iron for measuring the timewise variation in the temperature of said tip of said hot soldering iron, and
wherein each of said test units also includes means responsive to said control and said data signals received from said central control means via said exchanging means for transmitting data, indicative of said measured parameters produced by a set of said plurality of means as defined by said central control means, to said central control means via said exchanging means.

17. A system for monitoring the operation of electrostatic discharge control equipment located at each of a plurality of test units, each of which is programmable to perform from one to a plurality of predefined measurements, said electrostatic discharge control equipment including a conductive wrist strap on the wrist of a user, comprising:
central control means for regulating the operation of said plurality of test units;
means connected to and interconnecting said plurality of test units and said central control means for exchanging control and data signals therebetween;
wherein each of said test units include a plurality of measuring means, each performing one of said predefined measurements to measure a parameter of said electrostatic discharge control equipment, said plurality of measuring means comprising:
means for measuring the resistance of said conductive wrist strap;
means connected to earth ground and to an electrical ground associated with said test unit for continuously measuring the resistance between said earth ground and said electrical ground;
means, including a soldering iron test point, responsive to said user touching said soldering iron test point with the tip of a hot soldering iron for measuring the AC voltage appearing on said tip of said hot soldering iron;
means responsive to said user touching said soldering iron test point with said tip of said hot soldering iron for measuring the resistance between said tip of said hot soldering iron and said hot soldering iron's electrical ground connection;
means responsive to said user touching said soldering iron test point with said tip of said hot soldering iron for measuring the timewise variation in the temperature (temperature stability) of said tip of said hot soldering iron;
means, responsive to control signals received from said central control means specifying a set of said plurality of predefined measurements to be performed by said test unit for activating the ones of said measuring means included in said test unit corresponding to said defined set of measurements;
means responsive to any of the measured parameters falling outside (above or below) an associated predetermined range of values, including the maximum and minimum values in said range of values for generating a corresponding audible alarm indication and a red LED light failure indication;

means responsive to any of the measured parameters falling within said associated range of values for generating a corresponding green LED light pass indication.

18. A test system for regulating the operation of a plurality of test units, each of which is programmable to perform from one to a plurality of measurements on electrostatic discharge control systems associated with said test units comprising:

central control means for regulating the operation of said plurality of test units;

means connected to and interconnecting said central control means and said plurality of test units for exchanging control and data signals therebetween;

wherein each of said test units includes:

means programmable to perform from one to a plurality of measurements on said associated electrostatic discharge control systems to verify the operational integrity of said associated electrostatic discharge control systems, interface means connected to said exchanging means for providing an addressable interface to enable said central control means to access a single one of said test units;

wherein said central control means includes:

means for individually selecting a plurality of said test units;

means for programming said programmable means in each of said selected test units to conduct a set of said plurality of measurements, which set is defined by said programmable means for each of said selected test units.

19. The system of claim 18 wherein each of said test units include:

interface means connected to said exchanging means for providing an addressable interface to enable said central control means to access a single one of said test units.

20. The system of claim 18 wherein said interface means includes:

means responsive to control signals received from said central control means via said exchanging means for transmitting data, indicative of the results of said selected measurements conducted by said performing means, to said central control means via said exchanging means.

21. The system of claim 18 wherein said performing means includes:

means for intermittently or continuously measuring the resistance of a conductive wrist strap used by a worker at said test unit.

22. The system of claim 21 wherein said performing means further includes:

means for generating an alarm indication when said measured resistance of said conductive wrist strap is not within a predetermined range of values.

23. The system of claim 22 wherein said generating means includes:

means for producing an audible alarm indication when said measured resistance of said conductive wrist strap is not within said predetermined range of values.

24. The system of claim 22 wherein said generating means includes:

means for producing a green visual indication when said measured resistance of said conductive wrist strap is within said predetermined range of values, including said maximum and minimum values in said range of values a red visual indication when said measured resistance of said conductive wrist strap is without said predetermined range of values.

25. The system of claim 21 wherein said measuring means includes:

means for displaying the value of said measured write strap resistance.

26. The system of claim 18 wherein said performing means includes:

means connected to earth ground and an electrical ground associated with said test unit for measuring the resistance between said earth ground and said electrical ground.

27. The system of claim 26 wherein said performing means further includes:

means for generating an alarm indication when said measured resistance between earth ground and said electrical ground exceeds a predetermined threshold.

28. The system of claim 27 wherein said generating means includes:

means for producing an audible alarm indication when said measured resistance between earth ground and said electrical ground exceeds said predetermined threshold.

29. The system of claim 27 wherein said generating means includes:

means for producing a green visual indication when said measured resistance between earth ground and said electrical ground is less than or equal to said predetermined threshold, a red visual indication when said measured resistance between earth ground and said electrical ground is greater than said predetermined threshold.

30. The system of claim 26 wherein said measuring means includes:

means for displaying the value of said measured value of the resistance between earth ground and elecrical ground.

31. The system of claim 18 wherein said central control means includes:

means for automatically polling each of said test units to retrieve data therefrom indicative of said conducted measurements.

32. The system of claim 31 wherein said central control means further includes:

means responsive to said retrieved data for analyzing said retrieved data to verify the operational integrity of said electrostatic discharge control system associated with said test units and generate a number of predetermined test and analytical reports.

33. A system for monitoring the operation of electrostatic discharge control equipment located at each of a plurality of test units, each of which is programmable to perform from one to a plurality of predefined measurements, said electrostatic discharge control equipment including a conductive wrist strap on the wrist of a user, comprising:

central control means for regulating the operation of said plurality of test units, including:

means connected to said plurality of test units for exchanging control and data signals therebetween, means for selecting each of said test units independent of every other one of said test units, means for programming each of said test units to perform a set of said plurality of predefined measurements, which set is defined by said programming means for each of said selected test units;
wherein each of said test units include:
means, responsive to said programming means, for performing said set of predefined measurements to continuously or intermittently determine the resistance of said conductive wrist strap;
means responsive to said control and said data signals received from said central control means via said exchanging means for transmitting data indicative of said determined conductive wrist strap resistance to said central control means via said exchanging means.

34. The system of claim 33 further including:
means interposed between each of said test units and said exchanging means for providing a test unit specific addressable interface between said central control means and said associated test unit.

35. The system of claim 33 wherein said test unit further includes:
means, including a soldering iron test point, responsive to said user touching said soldering iron test point with the tip of a hot soldering iron for measuring the absolute value of the temperature of said tip of said hot soldering iron.

36. The system of claim 35 wherein said measuring means includes:
means for displaying the value of said absolute temperature of the tip of the soldering iron.

37. The system of claim 33 wherein said test unit further includes:
means, including a soldering iron test point, responsive to said user touching said soldering iron test point with the tip of a hot soldering iron for measuring the resistance between said tip of the hot soldering iron and the soldering iron's electrical ground connection.

38. The system of claim 37 wherein said measuring means includes:
means for displaying the value of said measured tip-to-ground resistance.

39. The system of claim 37 wherein said measuring means includes:
means for generating an alarm indication when said measured tip to ground resistance exceeds a predetermined threshold.

40. The system of claim 39 wherein said generating means includes:
means for producing a green colored indication when said measured tip to ground resistance is less than or equal to said predetermined threshold, a red colored indication when said measured tip to ground resistance is greater than said predetermined threshold.

41. The system of claim 33 wherein said determining means includes:
means for connecting a two-wire wrist strap to said test unit;
means for continuously monitoring the integrity of said two-wire wrist strap.

42. The system of claim 41 further including:
means for continuously displaying a green colored indication when said measured resistance of said two-wire wrist strap is inside of a predetermined range of values, being greater than a first predetermined threshold and less than a second predetermined threshold, a red colored indication when said measured resistance of said two-wire wrist strap is outside of said predetermined range of values, being equal to or less than said first predetermined threshold or equal to or greater than said second predetermined threshold.

43. The system of claim 41 further including:
means for generating an audible alarm when said measured resistance of said two-wire wrist strap is outside of a predetermined range of values.

44. The system of claim 33 wherein said test unit further includes:
means, including a soldering iron test point, responsive to said user touching said soldering iron test point with the tip of a hot soldering iron for measuring the temperature stability of said tip of the hot soldering iron.

45. The system of claim 44 wherein said measuring means includes:
means for displaying the value of said measured temperature stability.

46. The system of claim 44 wherein said measuring means includes:
means for generating an alarm indication when said measured tip temperature stability is less than a predetermined threshold.

47. The system of claim 46 wherein said generating means includes:
means for producing a green colored indication when said measured tip temperature stability is greater than or equal to said predetermined threshold, a red colored indication when said measured tip temperature stability is less than said predetermined threshold.

48. The system of claim 33 wherein said determining means includes:
means, including an electrical contact, responsive to said user touching said single wire conductive wrist strap to said electrical contact for determining the resistance of said conductive wire.

49. The system of claim 48 wherein said measuring means includes:
means for displaying the value of said measured resistance of said conductive wrist strap.

50. The system of claim 48 wherein said determining means further includes:
means for providing said user with an indication requesting said user to place said single wire conductive wrist strap in contact with said determining means.

51. The system of claim 50 wherein said determining means further includes:
means for generating an alarm indication when said measured resistance of said conductive wrist strap is outside of a predetermined range of values.

52. The system of claim 51 wherein said generating means includes:
means for producing an audible indication when said measured resistance of said conductive wrist strap is outside of said predetermined range of values.

53. The system of claim 51 wherein said generating means includes:
means for producing a green colored indication when said measured resistance of said conductive wrist strap is inside of said predetermined range of values, including the maximum and minimum values in said range of values a red colored indication when said measured resistance of said conductive wrist strap is outside of said predetermined range of values.

54. The system of claim 50 wherein said test unit further includes:
means connected to earth ground and to an electrical ground associated with said test unit for measuring the resistance between said earth ground and said electrical ground.

55. The system of claim 54 wherein said measuring means includes:
means for displaying the value of said measured resistance between electrical ground and earth ground.

56. The system of claim 54 wherein said measuring means includes:
means for generating an alarm indication when said measured resistance between earth ground and said electrical ground exceeds a predetermined threshold.

57. The system of claim 56 wherein said generating means includes:
means for producing a green colored indication when said measured resistance between earth ground and said electrical ground is less than or equal to said predetermined threshold, a red colored indication when said measured resistance between earth ground and said electrical ground is greater than said predetermined threshold.

58. The system of claim 50 wherein said determining means further includes:
means for generating an alarm indication when said measured resistance of said conductive wrist strap exceeds a predetermined threshold.

59. The system of claim 58 wherein said test unit further includes:
means, including a soldering iron test point, responsive to said user touching said soldering iron test point with the tip of a hot soldering iron for measuring the AC voltage appearing on said tip of the hot soldering iron.

60. The system of claim 59 wherein said measuring means includes:
means for displaying the value of said measured AC voltage on the tip of the hot soldering iron.

61. The system of claim 59 wherein said measuring means includes:
means for generating an alarm indication when said measured AC voltage exceeds a predetermined threshold.

62. The system of claim 61 wherein said generating means includes:
means for producing a green colored indication when said measured AC voltage is less than or equal to said predetermined threshold, a red colored indication when said measured AC voltage is greater than said predetermined threshold.

63. A system for monitoring the operational status of a plurality of soldering irons, each of said soldering irons associated with a test unit, each of said test units being programmable to perform from one to a plurality of predefined measurements on said associated soldering irons, comprising:
central control means for regulating the operation of said plurality of test units;
means connected to and interconnecting said central control means and said plurality of test units for exchanging control and data signals therebetween;
wherein each of said test units include a plurality of measuring means, each performing one of said predefined measurements to measure a parameter of said electrostatic discharge control equipment, said plurality of measuring means comprising:
means for generating a test current within the range of 10 to 1000 milliamps;
means, responsive to a worker at said test unit touching the tip of said associated soldering iron to a test point on said test unit, for applying said test current to said tip of said soldering iron;
means for generating data indicative of the resistance between said tip of said soldering iron and electrical ground measured via the voltage generated by the application of said test current to said tip of said soldering iron;
means, responsive to control signals received from said central control means, for transmitting said generated data to said central control means.

64. The system of claim 63 wherein said generating means comprises a current source.

65. The system of claim 63 wherein said test unit further includes:
means for generating an alarm indication when said measured resistance exceeds a predetermined threshold.

66. The system of claim 65 wherein said alarm generating means includes:
means for producing an audible alarm indication when said measured resistance exceeds said predetermined threshold.

67. The system of claim 65 wherein said alarm generating means includes:
means for producing a green colored visual indication when said measured resistance is less than said predetermined threshold, a red colored visual indication when said measured resistance is equal to or greater than said predetermined threshold.

68. A system for monitoring the operational status of one or more soldering irons, each of said soldering irons associated with a test unit that comprises:
means responsive to a worker at said test unit touching the tip of said soldering iron to a test point on said test unit for generating an analog electrical signal indicative of the temperature of the tip of said soldering iron;
means for storing the maximum (highest) values of said analog electrical signal as an indication of the maximum temperature of said soldering iron tip and the lowest value of said analog electrical signal as an indication of the minimum temperature of said soldering iron tip, over a predetermined time period.

69. The system of claim 68 wherein said storing means comprises:
differential amplifier means having inverting and non-inverting inputs;
feedback amplifier means having first and second sample and hold feedback loops;
said first sample and hold feedback loop for holding the maximum value of a cycling positive signal as measured over a predetermined time interval;
said second sample and hold feedback loop for holding the minimum value of said cycling positive signal as measured over said predetermined time interval;
means for applying said maximum value to said non-inverting input of said differential amplifier, said minimum value to said inverting input of said differential amplifier for extraction of the difference between the peak temperature and the valley temperature.

70. The system of claim 68 further including:

means for determining the difference between said stored highest and lowest values of said analog signal;

means responsive to said difference exceeding a predetermined threshold for generating an alarm indication.

71. The system of claim 70 wherein said generating means includes:

means for producing a green colored indication when said measured difference is less than said predetermined threshold, a red colored indication when said measured difference is equal to or greater than said predetermined threshold.

* * * * *